(12) United States Patent
Okahisa et al.

(10) Patent No.: US 11,469,356 B2
(45) Date of Patent: Oct. 11, 2022

(54) LIGHT SOURCE DEVICE

(71) Applicant: NICHIA CORPORATION, Anan (JP)

(72) Inventors: Tsuyoshi Okahisa, Tokushima (JP); Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 254 days.

(21) Appl. No.: 16/984,449

(22) Filed: Aug. 4, 2020

(65) Prior Publication Data

US 2020/0365781 A1 Nov. 19, 2020

Related U.S. Application Data

(62) Division of application No. 16/296,133, filed on Mar. 7, 2019, now Pat. No. 10,770,632.

(30) Foreign Application Priority Data

Mar. 9, 2018 (JP) .............................. JP2018-043350
Nov. 15, 2018 (JP) .............................. JP2018-214731

(51) Int. Cl.
*H01L 33/58* (2010.01)
*H01L 27/15* (2006.01)
(Continued)

(52) U.S. Cl.
CPC ............ *H01L 33/58* (2013.01); *F21S 41/663* (2018.01); *G03B 15/02* (2013.01); *H01L 27/156* (2013.01);
(Continued)

(58) Field of Classification Search
CPC ..... H01L 33/58; H01L 27/156; H01L 33/507; H01L 33/483; H01L 33/486; F21S 41/663; G03B 15/00
See application file for complete search history.

(56) References Cited

U.S. PATENT DOCUMENTS 9,269,848 B2 * 2/2016 Lermer ................. H01L 25/167
2004/0201987 A1 * 10/2004 Omata .................. H01L 33/486
362/800

(Continued)

FOREIGN PATENT DOCUMENTS

CN 206669629 U 11/2017
JP 2006-223762 A 8/2006
(Continued)

OTHER PUBLICATIONS

Non-Final Office Action on U.S. Appl. No. 16/296,133 dated Mar. 4, 2020.

(Continued)

*Primary Examiner* — Grant S Withers

(74) *Attorney, Agent, or Firm* — Foley & Lardner LLP

(57) ABSTRACT

A light source device includes: a light-shielding member defining an opening; a light-guide member located in the opening in a top view and including two or more divided lens portions; and a plurality of light-emitting parts disposed such that each of the plurality of light-emitting parts corresponds to a respective one of the lens portions, each of the plurality of light-emitting parts being configured to be individually turned on. Each of the light-emitting parts has an upper surface serving as a light-emitting surface. The two or more lens portions are Fresnel lenses. Irradiation areas corresponding to the light-emitting parts are at least partially different from each other.

19 Claims, 15 Drawing Sheets

(51) Int. Cl.
  *H01L 33/50*    (2010.01)
  *G03B 15/02*    (2021.01)
  *F21S 41/663*   (2018.01)
  *G03B 15/05*    (2021.01)

(52) U.S. Cl.
  CPC ............ *H01L 33/507* (2013.01); *G03B 15/05* (2013.01); *G03B 2215/0567* (2013.01); *G03B 2215/0592* (2013.01)

(56) References Cited

U.S. PATENT DOCUMENTS

| | | |
|---|---|---|
| 2007/0034890 A1 | 2/2007 | Daschner et al. |
| 2008/0144328 A1 | 6/2008 | Yagi et al. |
| 2013/0069084 A1 | 3/2013 | Daschner et al. |
| 2015/0380622 A1 | 12/2015 | Miyoshi et al. |
| 2017/0179360 A1 | 6/2017 | Miyoshi et al. |
| 2020/0073207 A1* | 3/2020 | Okahisa ............... G02B 3/0056 |

FOREIGN PATENT DOCUMENTS

| | | |
|---|---|---|
| JP | 2009-266974 A | 11/2009 |
| JP | 2012-150926 A | 8/2012 |
| JP | 5275557 B2 | 8/2013 |
| JP | 2016-027620 A | 2/2016 |
| JP | 2016-127145 A | 7/2016 |

OTHER PUBLICATIONS

Notice of Allowance on U.S. Appl. No. 16/296,133 dated May 6, 2020.

* cited by examiner

LIGHT SOURCE DEVICE

CROSS-REFERENCE TO RELATED APPLICATIONS

The present application is a divisional of U.S. patent application Ser. No. 16/296,133, filed on Mar. 7, 2019, which claims priority to Japanese Patent Application No. 2018-043350, filed on Mar. 9, 2018, and Japanese Patent Application No. 2018-214731, filed on Nov. 15, 2018. The contents of these applications are hereby incorporated by reference in their entireties.

BACKGROUND

1. Field of the Invention

The present disclosure relates to a light source device.

2. Description of Related Art

Light sources employing light-emitting elements such as light-emitting diodes have been widely used in recent years. For example, Japanese Patent No. 5275557 describes a light source that can be used for, for example, a flash for a small camera such as a cell phone camera.

SUMMARY

In recent years, light sources used for, for example, flashes for cameras have been required to be configured to selectively emit light in a desired direction.

Accordingly, one object of the present invention is to provide a light source configured to selectively emit light onto a desired irradiation area.

A light source device according to one embodiment of the present invention includes a light-shielding member defining an opening, a light-guide member located in the opening in a top view and including two or more divided lens portions, and a plurality of light-emitting parts disposed such that each of the plurality of light-emitting parts corresponds to a respective one of the lens portions and configured to be individually turned on. Each of the light-emitting parts has an upper surface serving as a light-emitting surface. The light-shielding member covers a portion of the light-emitting surface of at least one of the plurality of light-emitting parts in the top view. Irradiation areas corresponding to the light-emitting parts are at least partially different from each other.

The light source device having the above structure may allow for providing a light source that can selectively emit light onto desired irradiation areas that are at least partially different from each other.

BRIEF DESCRIPTION OF THE DRAWINGS

FIGS. 14A and 14B are schematic diagrams illustrating the illuminance distribution on an irradiated surface when all of nine light-emitting parts 1 and 1a to 1h in a light source device of an example are turned on.

FIGS. 15A and 15B are schematic diagrams illustrating the illuminance distribution on the irradiated surface when five light-emitting parts 1c, 1e, 1h, 1g, and 1f among the nine light-emitting parts 1 and 1a to 1h in the light source device of the example are turned on.

FIGS. 16A and 16B are schematic diagrams illustrating the illuminance distribution on the irradiated surface when one light-emitting part 1 located on the central portion among the nine light-emitting parts 1 and 1a to 1h in the light source device of the example is turned on.

FIGS. 17A and 17B are schematic diagrams illustrating the illuminance distribution on the irradiated surface when one light-emitting part 1b among the nine light-emitting parts 1 and 1a to 1h in the light source device of the example is turned on.

FIGS. 18A and 18B are schematic diagrams illustrating the illuminance distribution on the irradiated surface when one light-emitting part 1h among the nine light-emitting parts 1 and 1a to 1h in the light source device of the example is turned on.

DETAILED DESCRIPTION

Figure 1A:
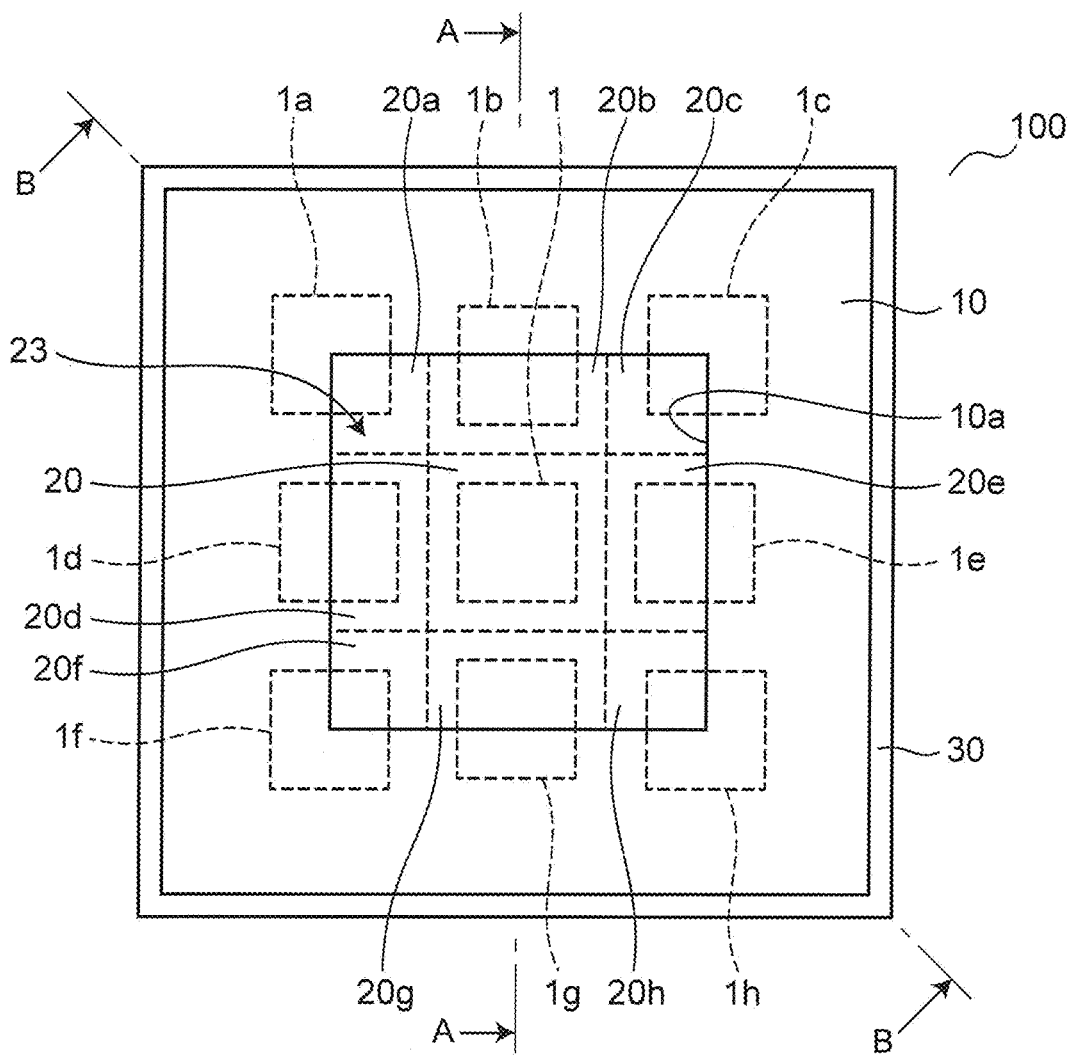
FIG. 1A is a schematic top view of an illustrative light source device according to a first embodiment.

A light source device according to a first embodiment of the present invention will be described below referring to the drawings.

Figure 1B:
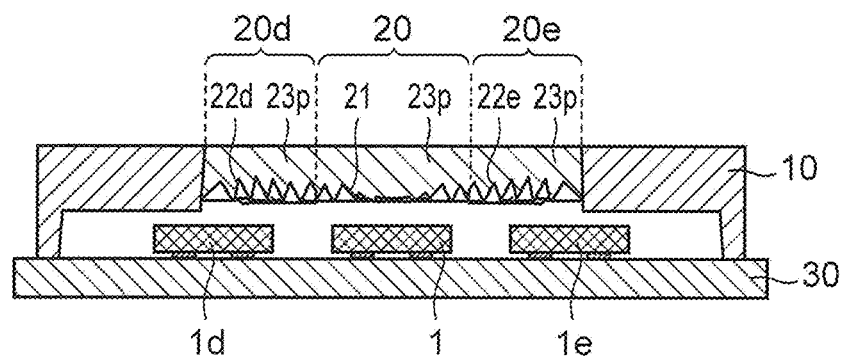
FIG. 1B is a schematic sectional view along the section A-A of FIG. 1A.
Figure 1C:
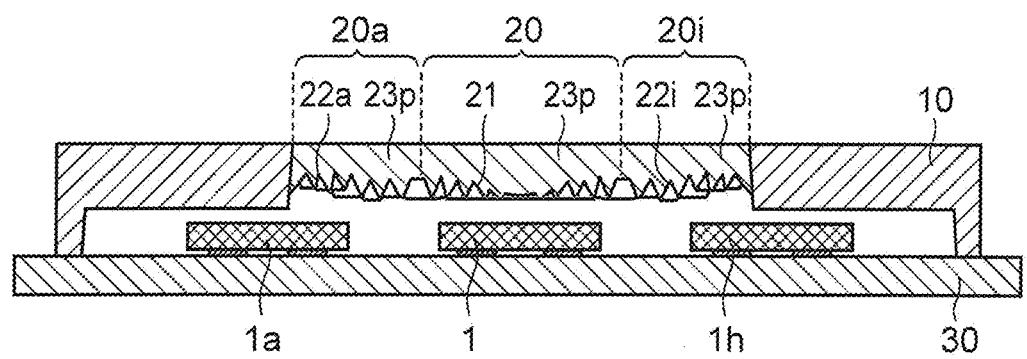
FIG. 1C is a schematic sectional view along the section B-B of FIG. 1A.

As shown in FIG. 1A to FIG. 1C, the light source device of the first embodiment includes (a) a plurality of light-emitting parts 1 and 1a to 1h that can be individually turned on, (b) a light-shielding member 10 having an opening 10a, and (c) a light-guide member 23 disposed in the opening 10a of the light-shielding member 10. The light-guide member 23 includes a plurality of lens portions 20 and 20a to 20h that are divided such that each of the lens portions 20 and 20a to 20h corresponds to a respective one of irradiation areas and to a respective one of the light-emitting parts 1 and 1a to 1h. Each of the lens portions 20 and 20a to 20h allows light emitted from the corresponding one of the light-emitting parts 1 and 1a to 1h to be irradiated onto the corresponding irradiation area.

An "irradiation area" in the present specification is an area in which light emitted in a certain direction is spread. A light source device in the present embodiment includes a plurality of light-emitting parts corresponding to a plurality of irradiation areas that differ from each other with respect to directions in which light is emitted. With this structure, when one or two or more light-emitting parts selected from the plurality of light-emitting parts are turned on, light can be irradiated onto a desired irradiation area or irradiation region. In the present specification, the expression "an irradiation area" refers to an area irradiated with light when a single light-emitting part is turned on, and the expression "an irradiation region" refers to a region irradiated with light emitted from two or more light-emitting parts when the two or more light-emitting parts are turned on. In the light source device of the present embodiment, the irradiation areas respectively corresponding to each of the light-emitting parts at least partially differ from each other.

The light source device of the first embodiment having the above structure can selectively project light onto a desired irradiation area or irradiation region. In addition, in the light source device according to certain embodiments, a light-shielding member 10 covers part of the light-emitting surface(s) of some of the light-emitting parts in a top view. This structure allows for increasing a difference between the illuminance in a desired irradiation area and the illuminance outside the irradiation area when light is irradiated onto the desired irradiation area.

The structure of the light source device of the first embodiment will be described in detail.

A light source device including nine light-emitting parts 1 and 1a to 1h and the nine lens portions 20 and 20a to 20h will be illustrated in the description of the light source device according to the first embodiment, but any appropriate number, being two or greater and selected according to a desired number of divided irradiation areas, of light-emitting parts and other components may be employed in the present invention.

1. Light-Emitting Parts (1) Arrangement of Light-Emitting Parts

In the light source device of the first embodiment, each of the light-emitting parts 1 and 1a to 1h have an upper surface serving as a light-emitting surface. The light-emitting parts 1 and 1a to 1h are arranged, for example, in a three-by-three matrix on a mounting board 30 as shown in, for example, FIGS. 1B and 1C. As used in the present specification, the expression "arranged in a matrix" encompasses not only an arrangement such that the centers of the light-emitting surfaces of the light-emitting parts 1 and 1a to 1h exactly coincide with lattice points of a square lattice or a rectangular lattice, but also an arrangement such that the centers of the light-emitting surfaces of the light-emitting parts 1 and 1a to 1h are located inward or outward of lattice points of the square lattice or the rectangular lattice. For example, in the light source device of the first embodiment, the light-emitting part 1, which is the central one of the plurality of light-emitting parts, and the light-emitting parts 1a, 1c, 1f, and 1h, which are at diagonal corners of the matrix of the plurality of light-emitting parts, coincide with lattice points of a square lattice, but the centers of the light-emitting surfaces of the light-emitting part 1b, the light-emitting part 1d, the light-emitting part 1e, and the light-emitting part 1g, which are located between the light-emitting parts 1a, 1c, 1f, and 1h at the diagonal corners of the matrix, are located inward of lattice points of the square lattice, as shown in FIG. 1A. The arrangement of the light-emitting parts 1 and 1a to 1h is appropriately selected in consideration of the properties of the lens portions and according to the shape and size of the opening 10a of the light-shielding member 10 such that the light-shielding member 10 covers a predetermined region of the light-emitting surface(s) of some of the light-emitting parts (e.g., in the light source device shown in FIG. 1A, the light-emitting parts 1a to 1h other than the light-emitting part 1 at the center of the matrix of the light-emitting parts).

The mounting board 30 is provided with positive and negative wirings. For example, with wirings corresponding to the light-emitting parts 1 and 1a to 1h respectively provided with input and output terminals, turning-on of light-emitting parts 1 and 1a to 1h can be individually controlled.

(2) Structure of Each Light-Emitting Part

Figure 1D:
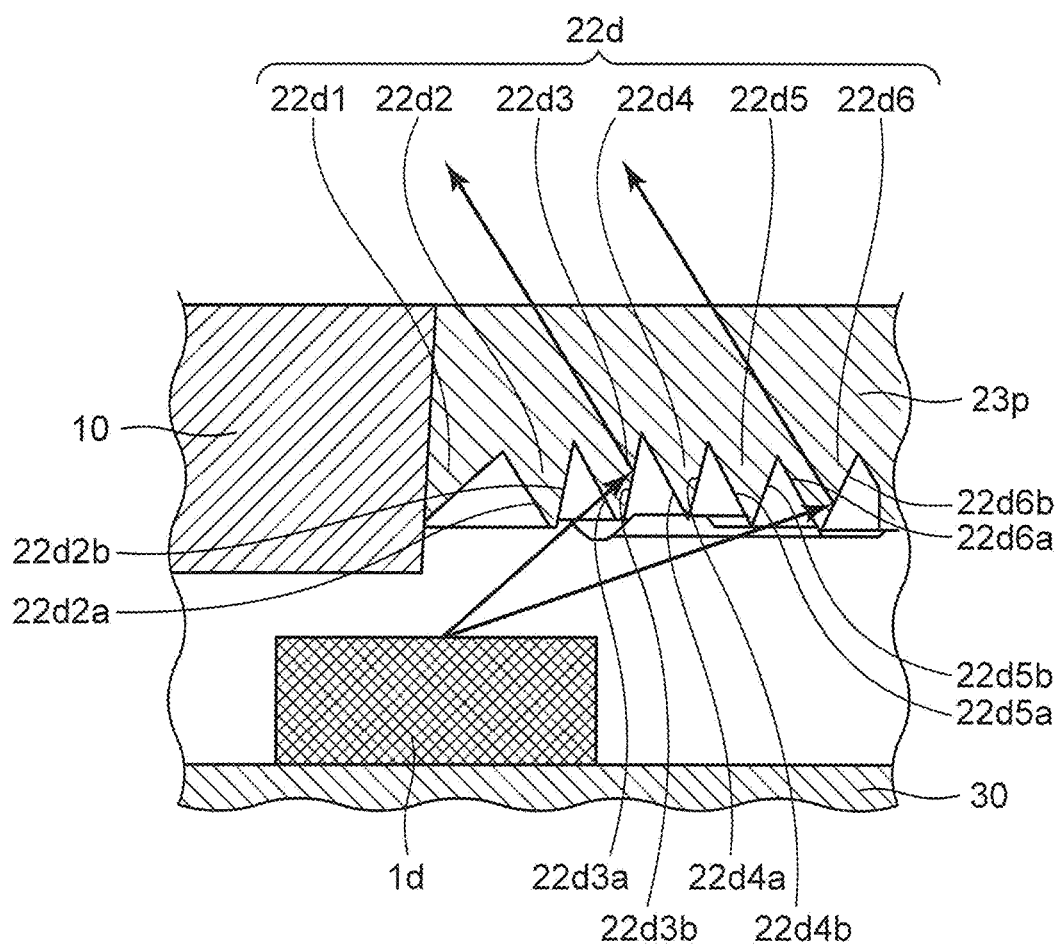
FIG. 1D is a schematic enlarged cross-sectional view of a part of FIG. 1B.
Figure 1E:
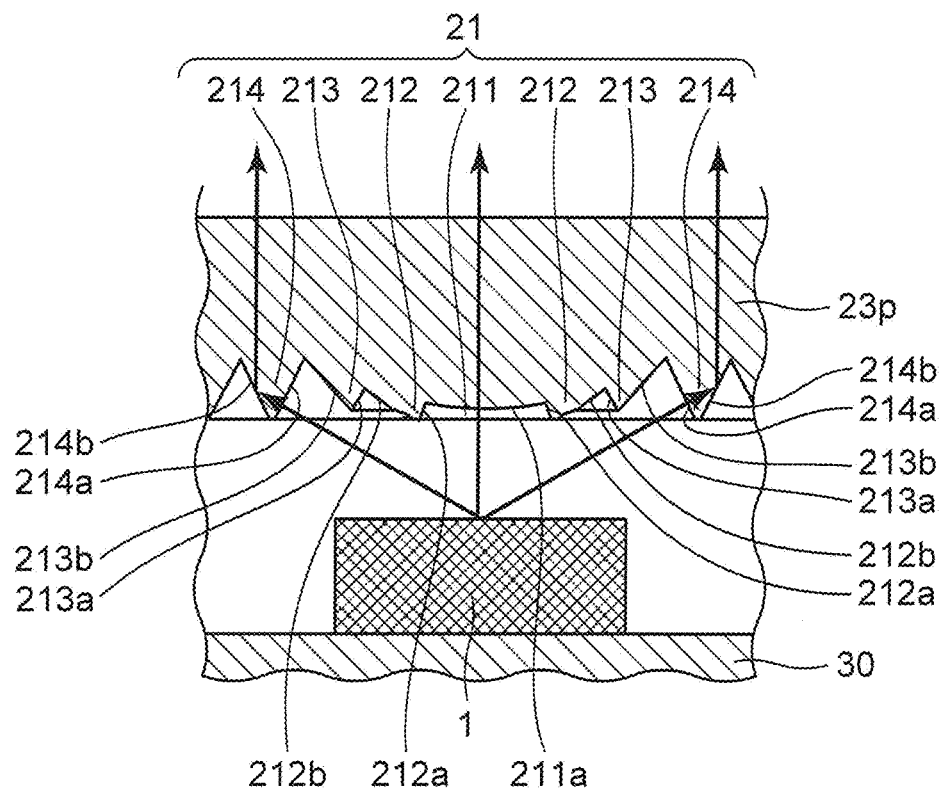
FIG. 1E is a schematic enlarged cross-sectional view of a part of FIG. 1B.
Figure 1F:
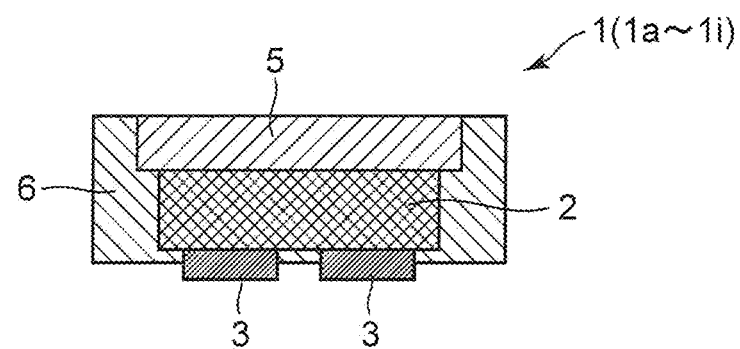
FIG. 1F is a schematic cross-sectional view of an example of a structure of a light-emitting part in the light source device according to the first embodiment.

For example, each of the light-emitting parts 1 and 1a to 1h includes a light-emitting element 2, a wavelength conversion member 5 on a light-emitting surface of the light-emitting element 2, and a reflective member 6 covering lateral surfaces of the light-emitting element 2 and lateral surfaces of the wavelength conversion member 5 except for the light-emitting surface of the wavelength conversion member 5, as shown in FIG. 1F. A lower surface, which is opposite to the light-emitting surface, of the light-emitting element 2 is provided with positive and negative electrodes. The positive and negative electrodes are exposed from the reflective member 6 and provided with external connecting electrodes, which are electrodes for connecting the light-emitting part to the outside. For example, the wavelength conversion member 5 contains a phosphor adapted to be excited by light emitted from the light-emitting element 2 and to emit light with a wavelength different from the wavelength of light emitted from the light-emitting element 2, which allows the light-emitting part to emit light having a desired color, such as white. In a light source device 100 of the first embodiment, the light-emitting parts 1 and 1a to 1h, each having the above structure, are connected to the wirings of the mounting board 30 described above.

Figure 1G:
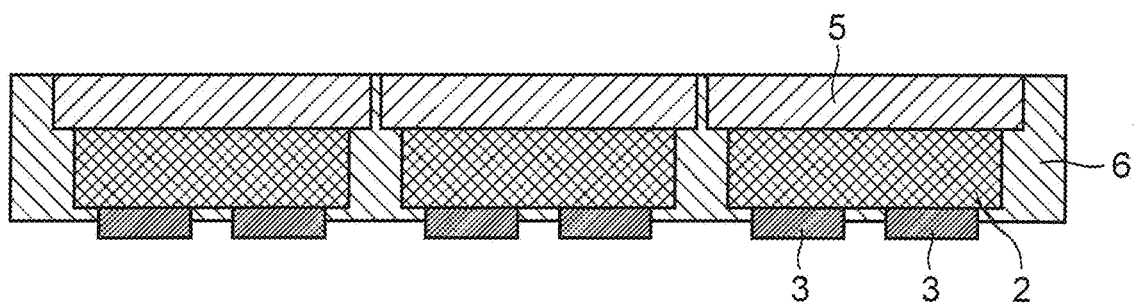
FIG. 1G is a schematic cross-sectional view of an illustrative integrated unit including a plurality of light-emitting parts in the light source device according to the first embodiment.

The light-emitting parts 1 and 1a to 1h described above and shown in FIG. 1F are separated from one another, but light-emitting parts 1 and 1a to 1h molded integrally with a single reflective member 6 as shown in FIG. 1G may be alternatively used in the light source device of the present embodiment. In the case of using the light-emitting parts 1 and 1a to 1h molded integrally with the single reflective member 6, the light source may not include the mounting board 30.

Figure 1H:
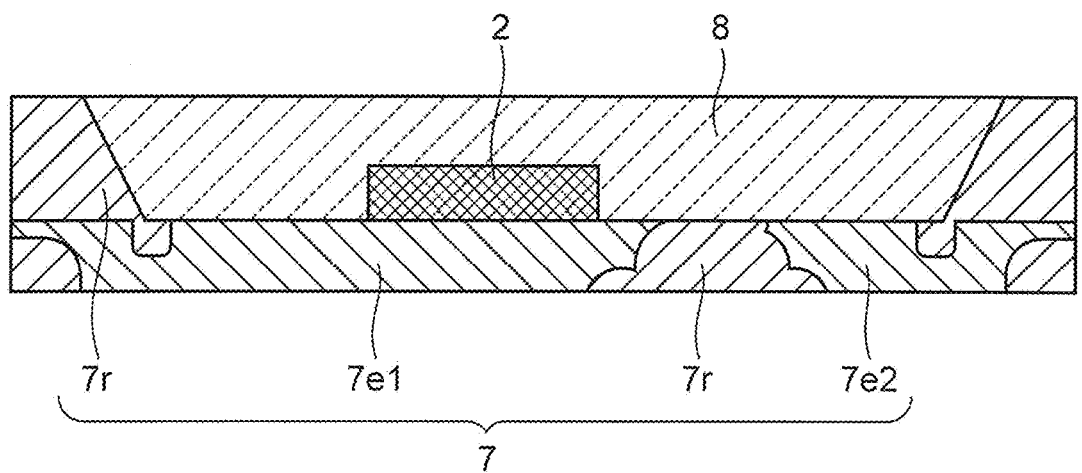
FIG. 1H is a schematic cross-sectional view of another illustrative structure of the light-emitting part in the light source device according to the first embodiment.

In the light source of the first embodiment, package-type light-emitting parts, an example of which is shown in FIG. 1H, may be used in place of the individual light-emitting parts 1 and 1a to 1h, an example of which is shown in FIG. 1F. The package-type light-emitting part includes, for example, a package 7 that includes a positive lead frame 7e1 and a negative lead frame 7e2 molded integrally with a resin part and defines a recess, a light-emitting element 2 disposed in the recess of the package 7, and a sealing resin 8 sealing the light-emitting element 2 in the recess of the package 7. The sealing resin 8 can contain a phosphor adapted to be excited by light emitted from the light-emitting element 2 and to emit light with a wavelength different from the wavelength of light emitted from the light-emitting element 2, which allows the light-emitting part to emit light having a desired color, such as white. In the case of using a package-type light-emitting part, instead of the sealing resin 8 containing the phosphor, three light-emitting elements including a red light-emitting element that emits red light, a green light-emitting element that emits green light, and a blue light-emitting element that emits blue light can be disposed in the recess of the package 7 to emit white light. In the case of disposing three light-emitting elements including a red light-emitting element, a green light-emitting element, and a blue light-emitting element in the recess of the package 7 to emit white light, for example, a phosphor can be contained in the sealing resin 8 to adjust emission color of the light emitting part.

2. Light-Shielding Member (1) Structure of Light-Shielding Member 10

The light-shielding member 10 can be made of, for example, a reflective resin containing a filler adapted to reflect light or a light-absorbing resin adapted to absorb light so as to narrow a distribution of light emitted from some of the light-emitting parts. Further, the light-shielding member 10 defines an opening 10a in which the light-guide member 23 is disposed so as to allow light emitted from the light-emitting parts 1 and 1a to 1h to be emitted through the light-guide member 23 (lens portions 20 and 20a to 20h). As shown in FIG. 1B and FIG. 1C, the light-shielding member 10 includes a loop-shaped projection along the outer periphery of a surface, facing the light-emitting surfaces of the light-emitting parts 1 and 1a to 1h, of the light-shielding member 10. With this structure, a gap is formed between the light-guide member 23 (lens portions 20 and 20a to 20h) and the light-emitting surfaces of the light-emitting parts 1 and 1a to 1h when the light-shielding member 10 is mounted on the mounting board 30 such that the light-shielding member 10 faces the light-emitting surfaces of the light-emitting parts 1 and 1a to 1h.

(2) Arrangement of Light-Shielding Member 10

Figure 1I:
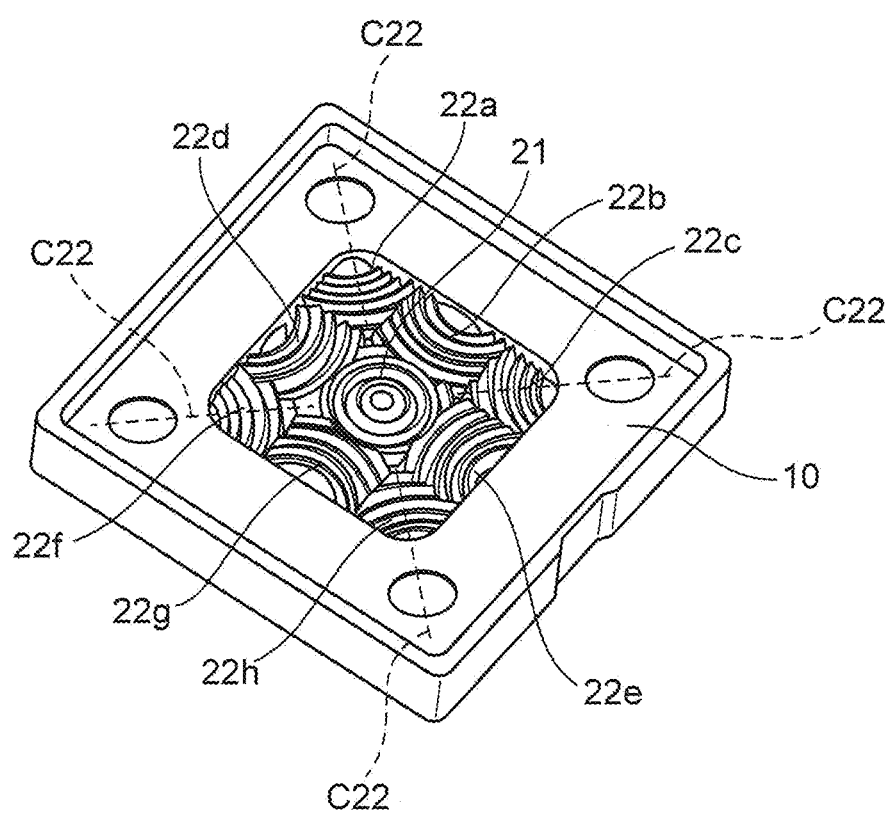
FIG. 1I is a schematic perspective view of a light-shielding member and a light-guide member disposed in an opening of the light-shielding member in the light source device according to the first embodiment viewed from the lower surface.

In the light source device of the first embodiment, the light-shielding member 10 having the above structure is arranged such that the light-shielding member 10 outside the opening 10a covers a portion of the light-emitting surface of each of the light-emitting parts 1a to 1h in a top view, without covering the light-emitting part 1 at the central portion in a top view. More specifically, for example, the opening 10a of the light-shielding member 10 has a substantially square shape having four corners, which are referred to as first to fourth corners, in a top view, and the light-shielding member 10 is arranged such that the first to fourth corners are located above the light-emitting surfaces of the light-emitting parts 1a, 1c, 1f, and 1h disposed at the four diagonal corners of the matrix of the plurality of light-emitting parts in a top view. As shown in FIG. 1I, one or more of the first to fourth corners may be rounded corners or slanted corners. As described above, in the light source device of the first embodiment shown in FIG. 1A and other drawings, the light-shielding member 10 covers a portion of the light-emitting surface of each of the light-emitting parts 1a, 1c, 1f, and 1h with a predetermined width from two outer sides of the light-emitting surface of a respective one of the light-emitting parts 1a, 1c, 1f, and 1h defining a respective one of the outermost corners of the light-emitting parts 1a, 1c, 1f, and 1h. A portion of the light-emitting part 1b, which is located between the light-emitting part 1a and the light-emitting part 1c, a portion of the light-emitting part 1d, which is located between the light-emitting part 1a and the light-emitting part 1f, a portion of the light-emitting part 1e, which is located between the light-emitting part 1c and the light-emitting part 1h, and a portion of the light-emitting part 1g, which is located between the light-emitting part 1f and the light-emitting part 1h, are also covered with the light-shielding member 10 with a predetermined width from the outermost side of the light-emitting surface of the light-emitting parts 1b, 1d, 1e, and 1g, respectively.

3. Light-Guide Member

In the light source device of the first embodiment, the light-guide member 23 is made of polycarbonate, acrylic, silicone resin, epoxy resin, or the like and includes the lens portions 20 and 20a to 20h demarcated to correspond to the light-emitting parts 1 and 1a to 1h, respectively. In other words, the light-guide member 23 is an integrated body of the lens portions 20 and 20a to 20h. The light-guide member 23 is disposed in the opening 10a of the light-shielding member 10 such that, for example, the upper surface of the light-shielding member 10 around the opening is in the same plane as the upper surface, which is the light-emitting surface, of the light-guide member 23.

4. Lens Portions

The light-guide member 23 is divided into the lens portions 20 and 20a to 20h corresponding to the light-emitting parts 1 and 1a to 1h, respectively. In FIG. 1B and FIG. 1C, each of the lens portions 20 and 20a to 20h of the light-guide member 23 is indicated as a unit light-guide member 23p. The lens portions 20 and 20a to 20h have lens functions of projecting light incident from the light-emitting parts 1 and 1a to 1h corresponding to the unit light-guide members 23p in predetermined directions. The lens function of the lens portions 20 and 20a to 20h is performed by, for example, a plurality of concentric loop-shaped projections or portions of a plurality of loop-shaped projections formed at the lower surface of the unit light-guide member 23p. In the present specification, the loop-shaped projections constitute a Fresnel lens. A lens portion including the projections in the form of loops is referred to as a "first Fresnel lens portion", and a lens portion including portions of loop-shaped projections is referred to as a "second Fresnel lens portion". In the present specification, the center of the loop-shaped projections of the first Fresnel lens portion may be referred to as "the center of the first Fresnel lens portion", and the center of the loop-shaped projections of the second Fresnel lens portion may be referred to as "the center of the second Fresnel lens portion".

Figure 2:
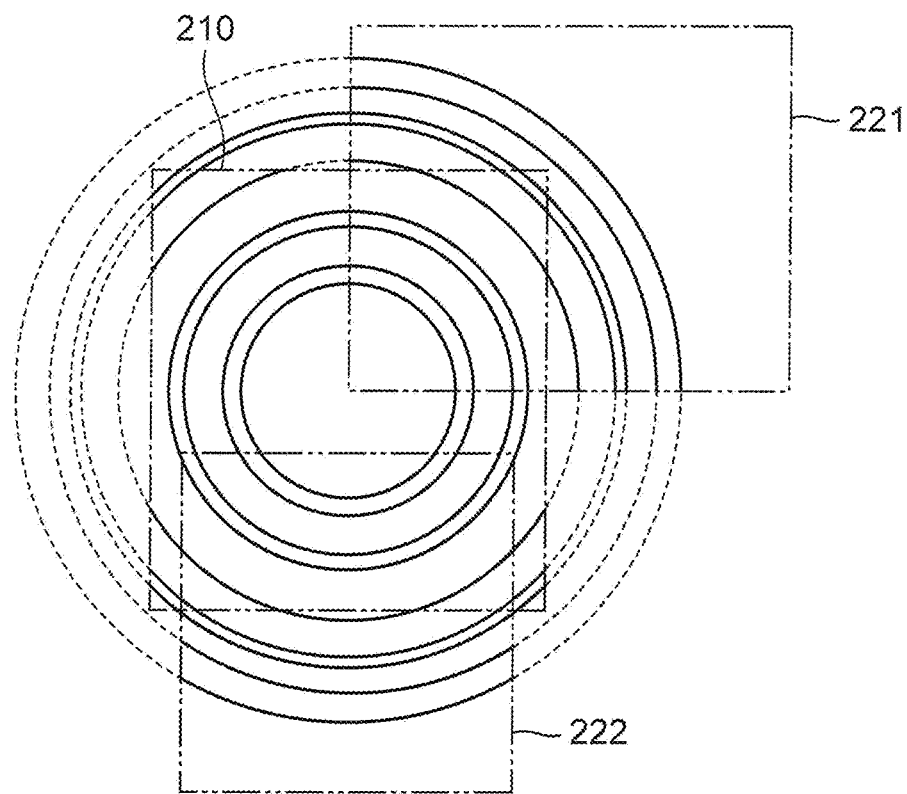
FIG. 2 is a schematic diagram illustrating the structures of a first Fresnel lens and a second Fresnel lens in the light source device according to the first embodiment.

More specifically, for example, the first Fresnel lens portion corresponds to, for example, a division of a corresponding Fresnel lens as shown in FIG. 2 demarcated by a region indicated by a reference numeral 210 shown in FIG. 2 including a plurality of loop-shaped projections, in which the first Fresnel lens includes a complete loop of a projection. For example, the second Fresnel lens portion corresponds to a division of a corresponding Fresnel lens in FIG. 2 demarcated by a region indicated by a reference numeral 221, or a division of a corresponding Fresnel lens in FIG. 2 demarcated by a region in FIG. 2 indicated by a reference numeral 222. Although one corner of the region 221 is illustrated to coincide with the center of the loop-shaped projections in FIG. 2, the region 221 may include the center of the loop-shaped projections in the region, or the center of the loop-shaped projections may be located outside the region. The second Fresnel lens, which corresponds to the region 221, is a fan-shaped portion of a Fresnel lens and is mainly used for, for example, the lens portions 20a, 20c, 20f, and 20h disposed on the diagonal corner portions of the matrix of the light-emitting portions 1 and 1a to 1h. The region 221 is appropriately selected such that light emitted from the light-emitting parts 1a, 1c, 1f, and 1h corresponding to the lens portions 20a, 20c, 20f, and 20h disposed at the diagonal corner of the lens portions 20a to 20h is irradiated onto a desired irradiation region.

In FIG. 2, the dividing region 222 is a region enclosed by two parallel straight lines between which the center of the Fresnel lens is located, and two other straight lines that are orthogonal to the two parallel straight lines and between which the center of the Fresnel lens is not located. The second Fresnel lens corresponding to the dividing region 222 is typically used for the lens portions 20b, 20d, 20e, and 20g between the lens portions 20a, 20c, 20f, and 20h disposed at the diagonal corner portions. The region 222 is appropriately selected such that light emitted from the light-emitting parts 1b, 1d, 1e, and 1h corresponding to the lens portions 20b, 20d, 20e, and 20g is irradiated onto a desired irradiation region.

The dividing regions 210, 221, and 222 are in the same Fresnel lens in the example described above, but alternatively, the first Fresnel lens portion may correspond to a division of a Fresnel lens including loop-shaped projections, and the second Fresnel lens portion may correspond to a division of another Fresnel lens including loop-shaped projections that include an innermost loop-shaped projection with a radius different from that of an innermost loop-shaped projection of the Fresnel lens corresponding to the first Fresnel lens portion, to constitute the lens portions of the same light source device. Further alternatively, the first Fresnel lens may correspond to a division of a Fresnel lens including loop-shaped projections, and the second Fresnel lens may correspond to a division of another Fresnel lens including loop-shaped projections with intervals between adjacent loop-shaped projections that are different from intervals between adjacent loop-shaped projections of the Fresnel lens corresponding to the first Fresnel lens, to constitute the lens portions of the same light source device. Even further alternatively, a second Fresnel lens portion may correspond to the dividing region 221 of a Fresnel lens, and another second Fresnel lens portion may correspond to the dividing region 222 of another Fresnel lens, to be used as lens portions in a single light source device.

The light source device of the first embodiment having the above structure can selectively project light onto a desired irradiation area if the light distribution characteristics of the first Fresnel lens portion or the second Fresnel lens portion formed on the lens portions respectively disposed corresponding to the light-emitting parts are appropriately selected on the basis of the positional relations with the corresponding light-emitting parts. This will be described below referring to more specific examples.

In the examples to be described below, the case in which light emitted from the light-emitting part 1 at the central portion is irradiated through the lens portion 20 onto an irradiation area located above the light-emitting part 1 and the case in which light emitted from the light-emitting part 1d adjacent to the light-emitting part 1 is irradiated through the lens portion 20d onto an irradiation area in a slant direction.

5. Distribution of Light Emitted from Light-Emitting Part 1 at Central Portion

FIG. 1E shows emission of light from the light-emitting part 1 disposed at the central portion through the lens portion 20.

First, the lens portion 20 includes a first Fresnel lens portion 21 having the structure as described below formed at the lower surface (surface facing the light-emitting surface of the light-emitting part 1) of a unit light-guide member 23p.

(1) First Fresnel Lens Portion 21

FIG. 1E is a schematic sectional view of the lens portion 20 shown in FIG. 1I. As shown in FIG. 1I and FIG. 1E, the first Fresnel lens portion 21 includes a plurality of annular projections. Specifically, the first Fresnel lens portion 21 includes a first projection 211, a second projection 212, a third projection 213, and a fourth projection 214 in the order from the center of the Fresnel lens. The second projection 212, the third projection 213, and the fourth projection 214 are annular projections. A convex lens surface having a central portion protruded downward (toward the light-emitting part) constitutes the first projection 211 located at the center, and the convex lens surface serves as an incidence surface. Each of the second projection 212, the third projection 213, and the fourth projection 214 is an annular projection. As shown in FIG. 1E, the second projection 212 has an incidence surface 212a and a reflection surface 212b, the third projection 213 has an incidence surface 213a and a reflection surface 213b, and the fourth projection 214 has an incidence surface 214a and a reflection surface 214b. The outer peripheries of the first projection 211, the second projection 212, the third projection 213, and the fourth projection 214 are concentric. The exit surface of the lens portion 20 is the upper surface of the unit light-guide member 23p.

(2) Arrangement of Light-Emitting Part 1

The light-emitting part 1 is arranged such that the optical axis of its light-emitting surface coincides with the optical axis of the first Fresnel lens portion 21. The light-emitting surface of the light-emitting part 1 is not covered with the light-shielding member 10 because this arrangement makes substantially entire light emitted from the light-emitting part 1 enter the first Fresnel lens portion 21.

(3) Distribution of Light Emitted from Light-Emitting Part 1

With the structure described above, for example, light emitted from the light-emitting surface of the light-emitting part 1 in the optical axis direction enter the incidence surface (convex lens surface) of the first projection 211 and travels straight in the optical axis direction as shown in FIG. 1E. Light that is emitted from the light-emitting surface of the light-emitting part 1 at a comparatively small angle with respect to the optical axis and enters the incidence surface of the first projection 211 is refracted at the incidence surface such that the angle with respect to the optical axis becomes smaller before entering the unit light-guide member 23p, and the light is then emitted through the exit surface.

For example, light that is emitted from the light-emitting surface of the light-emitting part 1 at a relatively large angle with respect to the optical axis enters the incidence surfaces 212a, 213a, and 214a of the second to fourth projections 212 to 214 according to the angle to the optical axis, and is reflected by the reflection surfaces 212b, 213b, and 214b of the second to fourth projections 212, 213, and 214 at a smaller angle with respect to the optical axis, and the light is then emitted through the exit surface.

Accordingly, light emitted from the light-emitting part 1 is projected onto an irradiation area that is located in front of the light source device 100 with the optical axis at the center of the irradiation area.

6. Distribution of Light Emitted from Light-Emitting Parts 1*a* to 1*h* Surrounding Central Light-Emitting Part 1

FIG. 1D shows emission of light from the light-emitting part 1*d* through the lens portion 20*d*.

The lens portion 20*d* includes a second Fresnel lens portion 22*d* having the structure described below formed on the lower surface (surface facing the light-emitting surface of the light-emitting part 1*d*) of a unit light-guide member 23*p*.

(1) Second Fresnel Lens Portion 22*d*

As shown in FIG. 1I, the second Fresnel lens portion 22*d* includes a portion of each of a plurality of annular projections. More specifically, the second Fresnel lens portion 22*d* includes a first projection 22*d*1, a second projection 22*d*2, a third projection 22*d*3, and a fourth projection 22*d*4 in the order from the center of the Fresnel lens. Each of the first projection 22*d*1, the second projection 22*d*2, the third projection 22*d*3, and the fourth projection 22*d*4 is a portion of an annular projection. The second projection 22*d*2 has an incidence surface 22*d*2*a* and a reflection surface 22*d*2*b*. The third projection 22*d*3 has an incidence surface 22*d*3*a* and a reflection surface 22*d*3*b*. The fourth projection 22*d*4 has an incidence surface 22*d*4*a* and a reflection surface 22*d*4*b*.

(2) Location of Light-Emitting Part 1*d*

The light-emitting part 1*d* is disposed such that a portion of a light-emitting surface of the light-emitting part 1*d* is covered with the light-shielding member 10 in a top view. In other words, the part of the light-emitting surface covered with the light-shielding member 10 does not face the second Fresnel lens portion 22*d*.

(3) Distribution of Light Emitted from Light-Emitting Part 1*d*

With the structure described above, light emitted from the light-emitting part 1*d* enters the unit light-guide member 23*p* through the incidence surface 22*d*2*a* of the second projection 22*d*2, the incidence surface 22*d*3*a* of the third projection 22*d*3, and the incidence surface 22*d*4*a* of the fourth projection 22*d*4 of the second Fresnel lens portion 22*d*. Light incident on the incidence surface 22*d*2*a*, the incidence surface 22*d*3*a*, and the incidence surface 22*d*4*a* is reflected by the reflection surface 22*d*2*b* of the second projection 22*d*2, and the reflection surface 22*d*3*b* of the third projection 22*d*3 and the reflection surface 22*d*4*b*, respectively, toward the outer side of the light source device in a top view.

The loop-shaped first to fourth projections 22*d*1 to 22*d*4 of the lens portion 20*d* allows for reducing lateral spread of light emitted from the light-emitting part 1*d*, that is, reducing spread of light in the direction in which the light-emitting part 1*a* and the light-emitting part 1*f* are arranged.

The case in which light emitted from the light-emitting part 1 disposed at the central portion is projected through the lens portion 20 onto an irradiation area above the light-emitting part 1, and the case in which light emitted from the light-emitting part 1*d* is irradiated through the lens portion 20*d* onto an irradiation area in a slant direction have been described above. Irradiation of light from the light-emitting parts 1*b*, 1*h*, and 1*e* through the respective lens portions 20*b*, 20*h*, and 20*e* onto irradiation areas in slant directions is substantially the same as projection of light from the light-emitting part 1*d* through the lens portion 20*d* onto an irradiation area in a slant direction.

(4) Distribution of Light Emitted from Light-Emitting Parts 1*a*, 1*c*, 1*f*, and 1*h*

Emission of light from the light-emitting parts 1*a*, 1*c*, 1*f*, and 1*h* through the respective lens portions 20*a*, 20*c*, 20*f*, and 20*h* is not illustrated in drawings but can be described as below.

The second Fresnel lens portions 22*a*, 22*c*, 22*f*, and 22*h* in the lens portions 20*a*, 20*c*, 20*f*, and 20*h* corresponding to the light-emitting parts 1*a*, 1*c*, 1*f*, and 1*h* at the diagonal corners of the plurality of light-emitting parts corresponds to fan-shaped divisions of a loop-shaped base Fresnel lens. The lens portions 20*a*, 20*c*, 20*f*, and 20*h* are disposed such that center lines C22 of the fan-shaped second Fresnel lens portions 22*a*, 22*c*, 22*f*, and 22*h* substantially coincide with the diagonal lines of the array of the light-emitting parts. As shown in FIG. 1I, the center lines C22 of the fan-shaped second Fresnel lens portions 22*a*, 22*c*, 22*f*, and 22*h* are lines each of which divides the corresponding fan-shaped second Fresnel lens portion into two areas that are in line-symmetry. The light-emitting parts 1*a*, 1*c*, 1*f*, and 1*h* are arranged such that, for example, the centers of their light-emitting surfaces thereof are on the center lines C22 of the fan-shaped second Fresnel lens portions 22*a*, 22*c*, 22*f*, and 22*h* or on the extensions of the center lines C22.

Each of the second Fresnel lens portions 22*a*, 22*c*, 22*f*, and 22*h* of the lens portions 20*a*, 20*c*, 20*f*, and 20*h* includes a plurality of projections each having an incidence surface and a reflection surface. Light emitted from the light-emitting parts 1*a*, 1*c*, 1*f*, and 1*h* enters the incidence surfaces of the projections constituting the second Fresnel lens portions 22*a*, 22*c*, 22*f*, and 22*h* and is reflected by the reflection surfaces at an angles in a predetermined range centered around the diagonal directions. In the lens portions 20*a*, 20*c*, 20*f*, and 20*h*, the second Fresnel lens portions 22*a*, 22*c*, 22*f*, and 22*h* correspond to fan-shaped divisions of a Fresnel lens, and respectively include a plurality of arc-shaped projections. This structure can confine the direction of light emitted from the light-emitting part and reflected by the reflection surfaces of the projections in a predetermined range of angles with respect to a diagonal direction of the light source device, reducing spread of light emitted from the light-emitting parts 1*a*, 1*c*, 1*f*, and 1*h* in a direction along which an adjacent light-emitting part is disposed.

A portion of the light-emitting surface of each of the light-emitting parts 1*a*, 1*c*, 1*f*, and 1*h* is covered with the light-shielding member, distribution characteristics of light according to the corresponding lens portion can be obtained by appropriately adjusting the position and region of the light-emitting surface covered with the light-shielding member.

7. First Fresnel Lens Portion and Second Fresnel Lens Portion

As described above, a plurality of light-emitting parts of the light source device of the first embodiment include light-emitting parts 1*a*, 1*c*, 1*f*, and 1*h* disposed at the four corners and the light-emitting part 1 disposed between the two diagonally opposite light-emitting parts 1*a* and 1*h* (or between the two light-emitting parts 1*c* and 1*f*) of the four light-emitting parts. The lens portion 20 corresponding to the light-emitting part 1 includes the first Fresnel lens portion, and each of the lens portions 20 corresponding to the other light-emitting parts includes the second Fresnel lens portion. The lens properties of the Fresnel lenses are based on the diameters of the projections and the shape of a cross-section of each projection.

The diameters of the projections and the shape of a cross-section of each projection of the first and second Fresnel lens portions are appropriately selected so that light emitted from the light-emitting parts is irradiated onto desired irradiation areas. The diameter of the outermost projection of the projections of the first Fresnel lens portion may be the same as or different from the diameter of the outermost projection of the projections of the second Fresnel lens portion. That is, a region to be effectively irradiated with light, more specifically, a distance from the light source to the irradiation area to be effectively with light from the light source device varies according to the environment in which the light source device is used, and the outermost projection of the projections has an appropriate diameter according to the position or area of the target irradiation region.

In the light source device of the first embodiment, for example, in the case in which the projections of each of the second Fresnel lens portions 22a, 22c, 22f, and 22h corresponding to the light-emitting parts 1a, 1c, 1f, and 1h at the four corner portions have annular shapes and in which each of the projections of the first Fresnel lens portion 21 correspond to the light-emitting part 1 at the center of the matrix of light-emitting parts, the radius of curvature of the outermost projection of the first Fresnel lens portion 21 is smaller than the radius of curvature of the outermost projection of each of the second Fresnel lens portions 22a, 22c, 22f, and 22h. With this structure, in a planar direction (i.e., in a direction of a plane parallel to the upper surface of the light-guide member), spreading of the light emitted from the light-emitting parts 1a, 1c, 1f, and 1h through the respective lens portions 20a, 20c, 20f, and 20h can be reduced compared to that of the light emitted from the light-emitting part 1 through the lens portion 20.

In the light source device of the first embodiment, for example, when the projections of each of the second Fresnel lens portions 22a, 22c, 22f, and 22h corresponding to the light-emitting parts 1a, 1c, 1f, and 1h at the four corner portions have annular shapes and the projections of each of the second Fresnel lens portion 22d disposed between the two second Fresnel lens portions 22a and 22f, the second Fresnel lens portion 22b disposed between the two second Fresnel lens portions 22a and 22c, the second Fresnel lens portion 22g disposed between the two second Fresnel lens portions 22f and 22h, and the second Fresnel lens portion 22e disposed between the two second Fresnel lens portions 22c and 22h have annular shapes, the radius of curvature of the outermost projection of the projections of each of the second Fresnel lens portions 22d, 22b, 22g, and 22e is larger than the radius of curvature of the outermost projection of the projections of each of the second Fresnel lens portions 22a, 22c, 22f, and 22h. With this structure, spread of light emitted from the light-emitting parts 1b, 1d, 1e, and 1g through the respective lens portions 20b, 20d, 20e, and 20g in the planar direction can be more greatly reduced compared with spread of light emitted from the light-emitting parts 1a, 1c, 1f, and 1h through the respective lens portions 20a, 20c, 20f, and 20h in the planar direction.

As described above, with the radius of curvature of the outermost projection of the first Fresnel lens portion 21 smaller than the radius of curvature of the outermost projection of each of the second Fresnel lens portions 22a, 22c, 22f, and 22h, spread of light emitted from the light-emitting parts 1a, 1c, 1f, 1h through the respective lens portions 20a, 20c, 20f, and 20h in the planar direction can be reduced, and spread of light emitted from the light-emitting parts 1b, 1d, 1e, and 1g through the respective lens portions 20b, 20d, 20e, and 20g in the planar direction can be further reduced. Thus, a light source device that can effectively project light onto a region of irradiation areas required to be illuminated when used as, for example, a light source for a flash for a cell phone camera, can be provided.

The lens properties of the first Fresnel lens portion and the second Fresnel lens portion will be described below referring to the cross-sectional view shown in FIG. 1D and FIG. 1E.

As described above, in the light source device according to the first embodiment, reflection by the reflection surfaces of the first Fresnel lens portion or the second Fresnel lens portion formed on a lens portion is used to irradiate a predetermined irradiation area with light emitted from the corresponding light-emitting part.

Accordingly, light emitted from the corresponding light-emitting part is reflected in a predetermined direction by the reflection surfaces of the first Fresnel lens portion or the second Fresnel lens portion. In other words, the shapes and orientations of the reflection surfaces in a vertical cross-section of the first Fresnel lens portion or the second Fresnel lens portion should be appropriately selected. Light to be reflected by the reflection surfaces of the first Fresnel lens portion or the second Fresnel lens portion is incident on the incidence surfaces of the first Fresnel lens portion or the second Fresnel lens portion. The light incident on the incidence surfaces is refracted at the incidence surfaces. Thus, the shapes and orientations of the incidence surfaces are should be appropriately selected. The refraction of light incident on the incidence surfaces and the reflection of light on the reflection surfaces are caused due to the difference between the refractive index of the light-guide member and the refractive index of the medium in contact with the light-guide member. Accordingly, when the shapes and orientations of the incidence surfaces and the reflection surfaces of the projections are selected, the difference between the refractive index of the light-guide member and the refractive index of the medium in contact with the light-guide member is also a parameter to be considered. In the light source device of the first embodiment, the medium in contact with the light-guide member is an air, and thus the difference between the refractive index of the light-guide member and the refractive index of the medium in contact with the light-guide member is the difference in refractive index between the light-guide member and the air.

The shapes and orientations of the reflection surfaces of the first Fresnel lens portion and/or the second Fresnel lens portion are selected according to the positional relation between the light-emitting part and the lens portion and the direction and extent of the corresponding irradiation area. For the light source device of the first embodiment, the position and region of the portion of the corresponding light-emitting surface covered with the light-shielding member are also considered.

More specifically, in the light source device of the first embodiment, light emitted from the light-emitting parts 1a, 1b, 1c, 1d, 1e, 1f, 1g, and 1h is distributed such that light traveling outward is reduced and light emitted toward above a central region (i.e., in the direction of light toward above the light-emitting part 1) onto a predetermined region is increased. Thus, the projections, and more specifically, the incidence surfaces and the reflection surfaces of the projections, have shapes and orientations such that light distributed in the direction toward the center is efficiently irradiated onto a desired irradiation area.

As described above, the shapes and orientations of the incidence surfaces and the reflection surfaces of the projections of the first Fresnel lens portion or the second Fresnel lens portion are required to be selected in consideration of various parameters in order to emit light emitted from the corresponding light-emitting part toward a desired irradiation area through the lens portion. The shapes and orientations can be easily selected by, for example, performing a simulation as described below.

The distribution characteristics of light emitted from the light-emitting surface of a light-emitting part are determined on the basis of the positional relationship between the light-emitting part and the light-shielding member by performing a simulation or measuring the emission intensity (first step). The expression "the positional relationship between the light-emitting part and the light-shielding member" encompasses the position and the region of the light-emitting surface of the light-emitting part covered with the light-shielding member, in a top view.

Subsequently, based on the resulting light distribution characteristics, light having a desired intensity is irradiated onto a desired irradiation area and is evaluated by performing a simulation or measurements of the illuminance distribution with various planar shapes of the projections of the first Fresnel lens portion and/or the second Fresnel lens portion and various shapes and orientations of the incidence surfaces and the reflection surfaces of the projections (second step). The measurement of the illuminance distribution is performed by, for example, irradiating an irradiation surface that is located at a predetermined distance away from a corresponding light-emitting part and includes a plurality of divided irradiation areas with light emitted from the corresponding light-emitting part, and by measuring the illuminance distribution of the irradiated light. In the case in which the illuminance distribution is determined by a simulation, the illuminance distribution in each of the divided irradiation areas on an irradiation surface that is assumed to be located at a predetermined distance away from a corresponding light-emitting part is determined.

To select the shapes and orientations of the incidence surfaces and the reflection surfaces of the projections of the first Fresnel lens portion or the second Fresnel lens portion as described above, after the evaluation of the second step, the first and second steps may be repeated with various positional relationships between the light-emitting part and the light-shielding member, which allows for determining a more suitable positional relationship between the light-emitting part and the light-shielding member, more suitable planar shapes of the projections of the first Fresnel lens portion and/or the second Fresnel lens portion, and more suitable shapes and orientations of the incidence surfaces and the reflection surfaces of the projections.

As the light source device of the first embodiment having the above structure includes the light-emitting parts 1 and 1a to 1h respectively corresponding to the irradiation areas and being capable of being individually turned on and the lens portions 20 and 20a to 20h respectively corresponding to the light-emitting parts 1 and 1a to 1h, the light source device can irradiate the irradiation areas respectively corresponding to the lens portions 20 and 20a to 20h with light emitted from the light-emitting parts 1 and 1a to 1h.

In addition, the light-shielding member 10 covers a portion of the light-emitting surface(s) of some of the light-emitting parts in a top view in the light source device of the first embodiment having structure described above. This structure allows for narrowing the distribution characteristics of light emitted from the light-emitting parts the light-emitting surfaces of which are partially covered such that the light is effectively irradiated onto a desired irradiation area, and allows for increasing the difference between the illuminance in the desired irradiation area and the illuminance outside the irradiation area when light is irradiated onto the desired irradiation area. For example, with the light source device shown in FIG. 1A and other drawings including the nine light-emitting parts 1 and 1a to 1h, the light-emitting part(s) that is turned on can be recognized by the illuminated irradiation area.

With the light-shielding member covering portions of the light-emitting surfaces of some of the light-emitting parts in the light source device of the first embodiment, the distribution characteristics of light emitted from a light-emitting part the light-emitting surface of which is partially covered can be characteristics corresponding to the lens portion depending on the position and region of the light-emitting surface covered with the light-shielding member. Accordingly, irradiation of light onto an area outside a desired irradiation area can be reduced while allowing irradiation of light onto the irradiation area. This structure allows for increasing the difference in illuminance between the inside and the outside of a boundary between the desired irradiation area and its adjacent irradiation area.

The above light source device of the first embodiment has been described referring to an example in which the nine light-emitting parts 1 and 1a to 1h are arranged in a matrix shown in FIG. 1A and other drawings.

The light source device of the first embodiment may include any appropriate number of light-emitting parts, as long as including at least two light-emitting parts.

The first Fresnel lens portion and the second Fresnel lens portion of the light source device of the first embodiment has been described based on a Fresnel lens including a plurality of annular projections.

However, in the light source device of the present embodiment, the first Fresnel lens portion or the second Fresnel lens portion may be based on, for example, a Fresnel lens including a plurality of substantially rectangular or substantially polygonal loop-shaped projections.

The description of the light source device of the first embodiment has not referred to the positional relationship between a first Fresnel lens portion or a second Fresnel lens portion formed on a lens portion and the center of the light-emitting surface of a light-emitting part corresponding to the lens portion. Modification in the positional relationship allows for obtaining various irradiation properties depending on the positional relationship.

The following describes variant examples of the light source device of the first embodiment will be described below.

First Variant Example

Figure 3:
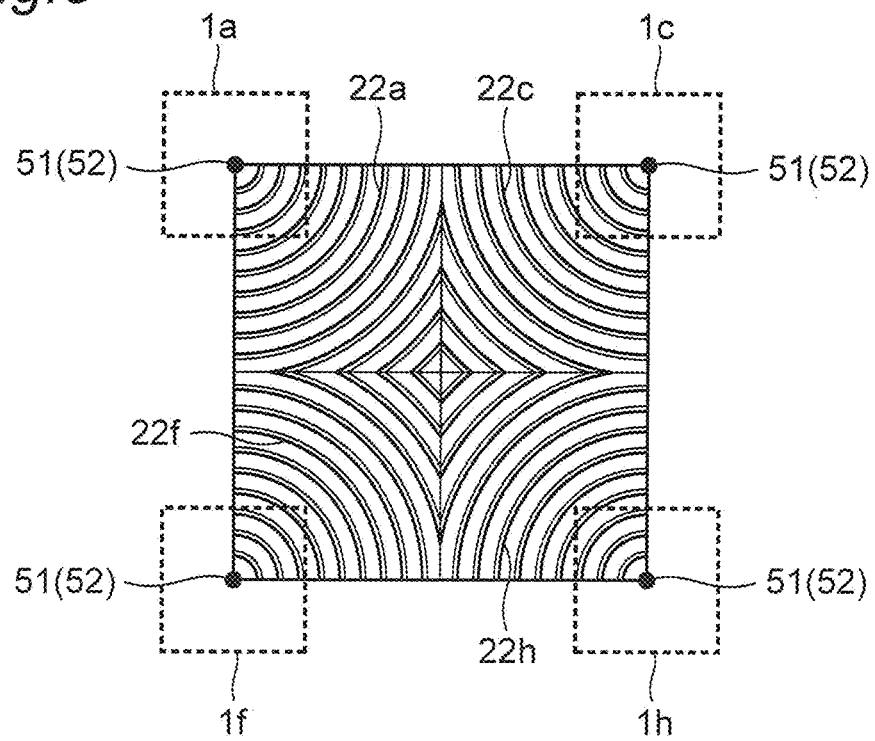
FIG. 3 is a schematic plan view of a light source device according to a first variant example.

FIG. 3 is a schematic plan view for illustrating the structure of a light source device of a first variant example. The light-shielding member is not shown in FIG. 3, but the light-emitting surfaces of the light-emitting parts are covered with the light-shielding member outside the lens portions. The same applies to FIG. 4 to FIG. 12 below.

The light source device of the first variant example differs from the light source device of the first embodiment in that four light-emitting parts and four lens portions respectively corresponding to each of the light-emitting parts constitute the light source device that can selectively irradiate light onto four divided irradiation areas.

Figure 4:
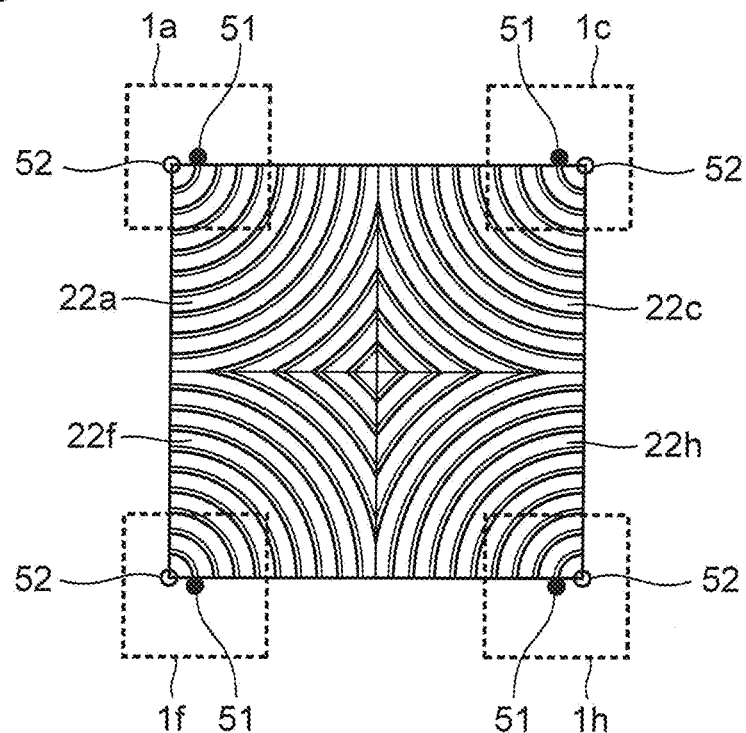
FIG. 4 is a schematic plan view of a variant example of the light source device according to the first variant example.

More specifically, the light source device of the first variant example includes four light-emitting parts 1a, 1c, 1f, and 1h, which are the same as the four light-emitting parts 1a, 1c, 1f, and 1h at the four corners of the matrix of the plurality of light-emitting parts in the light source device of the first embodiment, and four lens portions 20a, 20c, 20f, and 20h, which correspond to the light-emitting parts 1a, 1c, 1f, and 1h and are the same as four lens portions 20a, 20c, 20f, and 20h in the light source device of the first embodiment. The lens portions 20a, 20c, 20f, and 20h include the second Fresnel lens portions 22a, 22c, 22f, and 22h, respectively. In the light source device of the first variant example, the second Fresnel lens portions 22a, 22c, 22f, and 22h are arranged such that a square is formed by imaginary lines connecting centers 52 of corresponding Fresnel lenses of the second Fresnel lens portions 22a, 22c, 22f, and 22h, and the light-emitting parts 1a, 1c, 1f, and 1h are also arranged such that a square is formed by imaginary lines connecting the centers 51 of the light-emitting surfaces of the light-emitting parts 1a, 1c, 1f, and 1h. In the light source device of the first variant example shown in FIG. 3, the light-emitting parts 1a, 1c, 1f, and 1h and the lens portions 20a, 20c, 20f, and 20h are arranged such that the centers 51 of the light-emitting surfaces of the light-emitting parts 1a, 1c, 1f, and 1h coincide with the centers 52 of corresponding Fresnel lenses of the second Fresnel lens portions 22a, 22c, 22f, and 22h. However, in the light source device of the first variant example, the light-emitting parts 1a, 1c, 1f, and 1h and the lens portions 20a, 20c, 20f, and 20h may be arranged such that the centers 51 of the light-emitting surfaces of the light-emitting parts 1a, 1c, 1f, and 1h are displaced from the centers 52 of corresponding Fresnel lenses of the second Fresnel lens portions 22a, 22c, 22f, and 22h as shown in FIG. 4. Change in the arrangement of the light-emitting parts 1a, 1c, 1f, and 1h and the lens portions 20a, 20c, 20f, and 20h as described above allows for adjusting or changing the extent of each of the irradiation areas respectively corresponding to the light-emitting parts 1a, 1c, 1f, and 1h and the illuminance distribution in each irradiation area.

Second Variant Example

Figure 5:
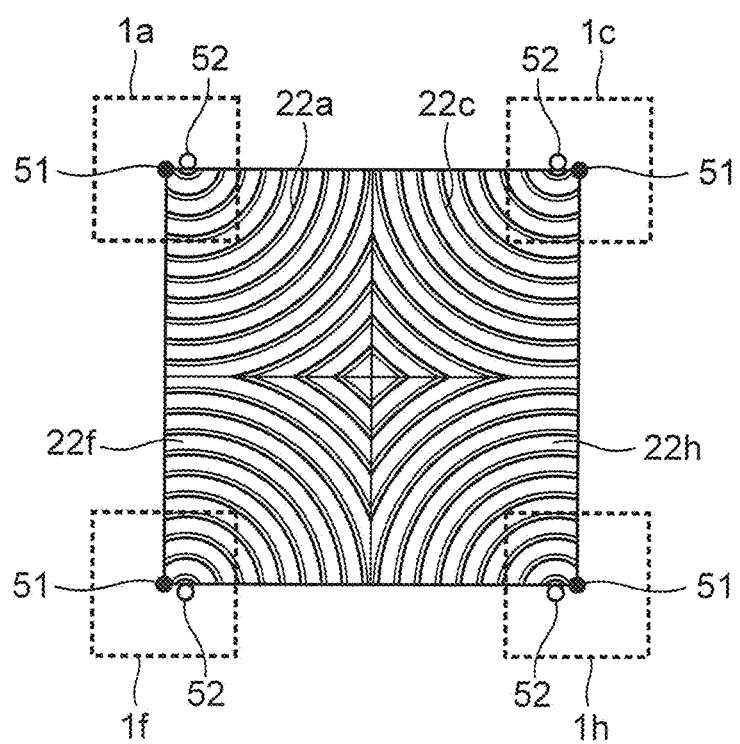
FIG. 5 is a schematic plan view of a light source device according to a second variant example.

FIG. 5 is a schematic plan view for illustrating the structure of a light source device of a second variant example.

The light source device of the second variant example is substantially the same as the light source device of the first variant example shown in FIG. 3 except for the shape of the second Fresnel lens portions 22a, 22c, 22f, and 22i and the positional relationship between the light-emitting parts 1a, 1c, 1f, and 1i and the lens portions 20a, 20c, 20f, and 20h.

More specifically, in the light source device of the first variant example, each of the second Fresnel lens portions 22a, 22c, 22f, and 22h in the lens portions 20a, 20c, 20f, and 20h corresponds to a quadrangular-shaped dividing region 221 of a Fresnel lens shown in FIG. 2, in which a corner of the quadrangular-shaped dividing region 221 coincides with the center of the corresponding Fresnel lens.

On the other hand, in the light source device of the second variant example, each of the second Fresnel lens portions 22a, 22c, 22f, and 22h in the lens portions 20a, 20c, 20f, and 20h corresponds to a quadrangular dividing region of the Fresnel lens in FIG. 2, in which a corner of the quadrangular dividing region is located outside the center of the Fresnel lens in FIG. 2. Modification of the dividing region 221 of the corresponding Fresnel lens used to constitute the second Fresnel lens portions 22a, 22c, 22f, and 22h as described above allows for adjusting or modifying the extent of each of the irradiation areas respectively corresponding to the light-emitting parts 1a, 1c, 1f, and 1h and the illuminance distribution in each irradiation area.

In the light source device of the second variant example, the light-emitting parts 1a, 1c, 1f, and 1h and the lens portions 20a, 20c, 20f, and 20h are arranged such that the centers 51 of the light-emitting surfaces of the light-emitting parts 1a, 1c, 1f, and 1h are offset from the centers 52 of corresponding Fresnel lenses of the second Fresnel lens portions 22a, 22c, 22f, and 22h as shown in FIG. 5. Change in the arrangement of the light-emitting parts 1a, 1c, 1f, and 1h and the lens portions 20a, 20c, 20f, and 20h as described above allows for adjusting or changing the extent of each of the irradiation areas respectively corresponding to the light-emitting parts 1a, 1c, 1f, and 1h and the illuminance distribution in each irradiation area.

In the light source device of the second variant example having the above structure, each of the second Fresnel lens portions 22a, 22c, 22f, and 22h corresponds to a region of a Fresnel lens that is different from the square region dividing 221, shown in FIG. 2 and having a corner that coincides with the center of the Fresnel lens, of the Fresnel lens, and the positional relationships between the light-emitting parts 1a, 1c, 1f, and 1h and the lens portions 20a, 20c, 20f, and 20h are different from a basic arrangement in which the centers of the second Fresnel lens portions 22a, 22c, 22f, and 22i coincide with the centers of the light-emitting surfaces of the light-emitting parts 1a, 1c, 1f, and 1h. Light can be therefore more appropriately irradiated onto a desired irradiation area.

Third Variant Example

Figure 6:
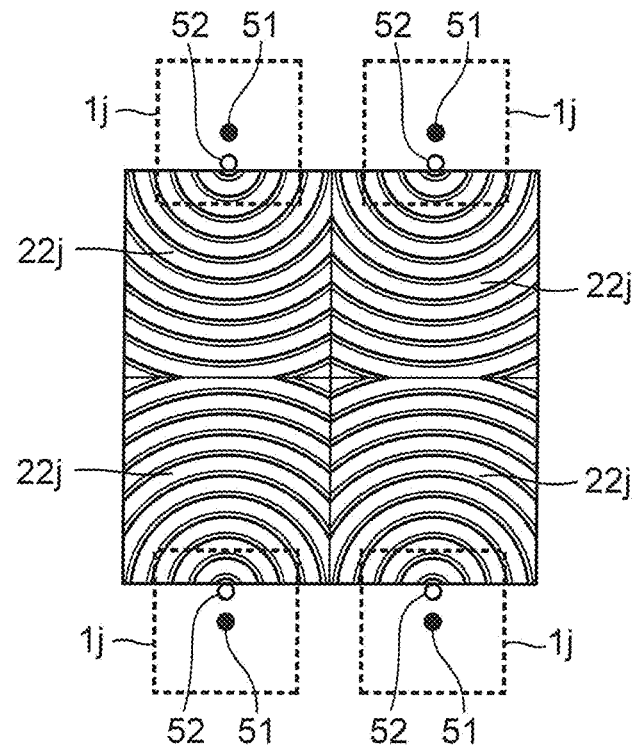
FIG. 6 is a schematic plan view of a light source device according to a third variant example.

FIG. 6 is a schematic plan view for illustrating the structure of a light source device of a third variant example.

The light source device of the third variant example includes four lens portions that are substantially the same as the lens portions 20b and 20g in the light source device of the first embodiment, and is configured to irradiate light onto four irradiation areas.

That is, in the light source device of the third variant example, the lens portions include four second Fresnel lens portions 22j each corresponding to the dividing region 222 shown in FIG. 2. The four second Fresnel lens portions 22j are arranged such that the shape formed by imaginary lines connecting the centers of the Fresnel lenses is a substantially elongated rectangle (hereinafter referred to as a first elongated rectangle). Light-emitting parts 1j in the light source device of the third variant example are arranged such that the shape formed by imaginary lines connecting the centers of their light-emitting surfaces is a substantially elongated rectangle (hereinafter referred to as a second elongated rectangle). Each of the two long sides of the second elongated rectangle is located on the same straight line as a respective one of the long sides of the first elongated rectangle. The center of the second elongated rectangle coincides with the center of the first elongated rectangle. The long sides of the second elongated rectangle are longer than the long sides of the first elongated rectangle. In the light source device of the third variant example having the above structure, the centers of the light-emitting surfaces of the light-emitting parts 1j are located outside the centers of the respective second Fresnel lens portions 22j. The distance between the center of the light-emitting surface of a light-emitting part 1j and the center of the corresponding second Fresnel lens portion 22j is substantially a half of the length of the long sides of the second elongated rectangle and the length of the long sides of the first elongated rectangle.

An irradiation area that is illuminated by the light source device of the third variant example having the above structure and corresponds to each of the light-emitting parts 1j can have a length in the direction of the long sides of the first elongated rectangle and the second elongated rectangle longer than the length in the direction of the short sides of the first elongated rectangle and the second elongated rectangle.

As described for the light source devices of the first embodiment and the first to third variant examples above, in a light source device according to a certain embodiment, examples of the shapes of a plurality of projections of the base Fresnel lenses of the first and second Fresnel lens portions include various loop shapes such as concentric circles, concentric ellipses, and concentric rectangles.

As described for the light source devices of the first embodiment and the first to third variant examples described above, a light source device according to a certain embodiment includes: a plurality of light-emitting parts including four light-emitting parts arranged such that the shape formed by imaginary lines connecting the centers of the light-emitting surfaces of the four light-emitting parts is a rectangle and such that portions of the light-emitting surfaces are covered with the light-shielding member outside the opening, and four second Fresnel lens portions that are arranged such that the shape formed by imaginary lines connecting the centers of a plurality of loop-shaped projections is a rectangle and serve as lens portions each corresponding to a respective one of the four light-emitting parts.

As described for the light source devices of the first embodiment and the first to third variant examples above, in a light source device according to a certain embodiment, the shape formed by imaginary lines connecting the centers of the light-emitting surfaces of the light-emitting parts is a square, and the shape formed by imaginary lines connecting the centers of a plurality of loop-shaped projections is an elongated rectangle.

As described for the light source devices of the first embodiment and the first to third variant examples above, in a light source device according to a certain embodiment, the shape formed by imaginary lines connecting the centers of the light-emitting surfaces of the light-emitting parts is an elongated rectangle, and the shape formed by imaginary lines connecting the centers of a plurality of loop-shaped projections is a square.

As described for the light source devices of the first embodiment and the first to third variant examples above, in a light source device according to a certain embodiment, the shape formed by imaginary lines connecting the centers of the light-emitting surfaces of the light-emitting parts is an elongated rectangle, and the shape formed by imaginary lines connecting the centers of a plurality of loop-shaped projections is an elongated rectangle.

As described for the light source devices of the first embodiment and the first to third variant examples above, in a light source device according to a certain embodiment, the shape formed by imaginary lines connecting the centers of the light-emitting surfaces of the light-emitting parts is a square, and the shape formed by imaginary lines connecting the centers of a plurality of loop-shaped projections is a square.

As described for the light source devices of the first embodiment and the first to third variant examples above, in a light source device according to a certain embodiment, distances between the centers of adjacent ones of the light-emitting surfaces of four light-emitting parts at the four corners are shorter than the distances between adjacent ones of the centers of the loop-shaped projections of four second Fresnel lens portions each corresponding to a respective one of the four light-emitting parts.

As described for the light source devices of the first embodiment and the first to third variant examples above, in a light source device according to a certain embodiment, distances between the centers of the light-emitting surfaces of four light-emitting parts at the four corners are longer than the distances between the centers of the loop-shaped projections of four second Fresnel lens portions each corresponding to a respective one of the four light-emitting parts.

As described for the light source devices of the first embodiment and the first to third variant examples above, in a light source device according to a certain embodiment, the shapes of four lens portions corresponding to four light-emitting parts at four corners are substantially the same.

As described for the light source devices of the first embodiment and the first to third variant examples above, in a light source device according to a certain embodiment, the light-emitting surface of each of four light-emitting parts at four corners have a quadrilateral shape, and the light-shielding member covers a portion of each of the quadrilateral light-emitting surfaces with a predetermined width from a side of each of the quadrilateral light-emitting surfaces.

As described for the light source devices of the first embodiment and the first to third variant examples above, in a light source device according to a certain embodiment, the light-emitting surface of each of four light-emitting parts at four corners have a quadrilateral shape, and the light-shielding member covers a portion of each of the quadrilateral light-emitting surfaces with a predetermined width from each of two sides defining a corner of each of the quadrilateral light-emitting surfaces.

As described for the light source devices of the first embodiment and the first to third variant examples above, a light source device according to a certain embodiment includes four light-emitting parts at four corners and an additional light-emitting part between two light-emitting parts, diagonally opposite to each other, of the four light-emitting parts, and a lens portion corresponding to the additional light-emitting part and including a first Fresnel lens portion.

As described for the light source devices of the first embodiment and the first to third variant examples above, in a light source device according to a certain embodiment, a plurality of projections of second Fresnel lens portions corresponding to four light-emitting parts at four corners have annular shapes, a plurality of projections of a first Fresnel lens portion corresponding to the additional light-emitting part between two light-emitting parts, diagonally opposite to each other, of the four light-emitting parts have annular shapes, and the radius of curvature of the outermost projection of the first Fresnel lens portion corresponding to the additional light-emitting part is smaller than the radius of curvature of the outermost projection of each of the second Fresnel lens portions each corresponding to a respective one of the four light-emitting parts.

As described for the light source devices of the first embodiment and the first to third variant examples above, a light source device according to a certain embodiment includes: four light-emitting parts disposed such that the shape formed by imaginary lines connecting the centers of the light-emitting surfaces of the four light-emitting parts is a rectangle; a further additional light-emitting part disposed between two corresponding light-emitting parts disposed at both ends of a side of the rectangle, of the four light-emitting parts; and a lens portion corresponding to the further additional light-emitting part and including a second Fresnel lens portion.

The light source device of the first embodiment described above may include: a plurality of the further additional light-emitting parts each disposed between two corresponding light-emitting parts, disposed at both ends of a corresponding side of the rectangle formed by imaginary lines connecting the centers of the light-emitting surfaces of the four light-emitting parts, of the four light-emitting parts; and lens portions each corresponding to a respective one of the further additional light-emitting parts and having substantially the same shape.

In the light source device of the embodiment described above, the light-emitting surface of the further additional light-emitting part between two light-emitting parts at both ends of a corresponding side of the rectangle formed by imaginary lines connecting the centers of the light-emitting surfaces of the four light-emitting parts may have a quadrilateral shape, and a portion of the quadrilateral light-emitting surface with a predetermined width from a side of the quadrilateral light-emitting surface may be covered with the light-shielding member.

In addition, in the light source device of the first embodiment described above, a plurality of projections of the second Fresnel lens portions corresponding to the four light-emitting parts disposed such that the shape formed by imaginary lines connecting the centers of the light-emitting surfaces of the four light-emitting parts is a rectangle may have annular shapes; a plurality of projections of the second Fresnel lens portion corresponding to the further additional light-emitting part between two light-emitting parts at both ends of a corresponding side of the rectangle formed by imaginary lines connecting the centers of the light-emitting surfaces of the four light-emitting parts may have annular shapes; and the radius of curvature of the outermost projection of the projections of the second Fresnel lens portion corresponding to the further additional light-emitting part may be larger than the radius of curvature of the outermost projection of the projections of each of the second Fresnel lens portions corresponding to the four light-emitting parts disposed such that the shape formed by imaginary lines connecting the centers of light-emitting surfaces of the four light-emitting parts is a rectangle.

Further other variant examples will be described below.

Fourth Variant Example

Figure 7:
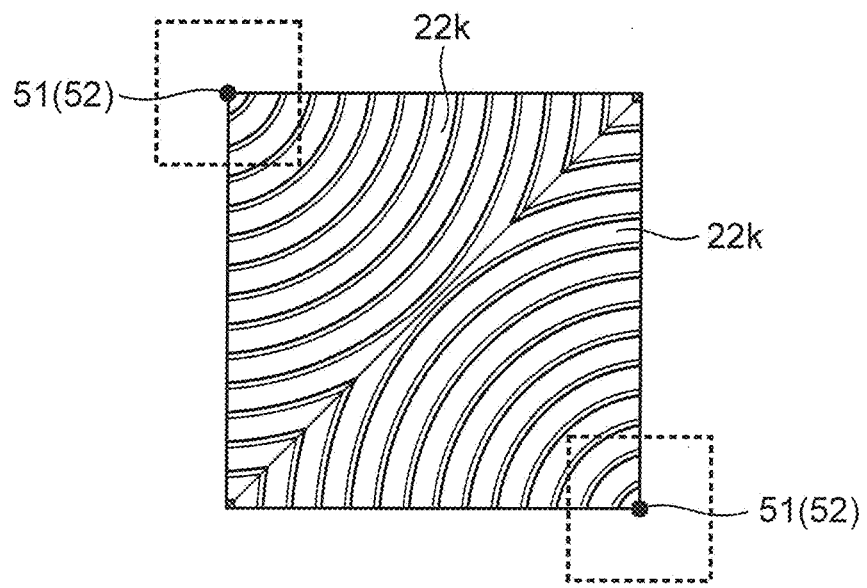
FIG. 7 is a schematic plan view of a light source device according to a fourth variant example.

FIG. 7 is a schematic plan view for illustrating the structure of a light source device of a fourth variant example.

The light source device of the fourth variant example includes lens portions each including a second Fresnel lens portion 22$k$ corresponding to a triangular dividing region of a corresponding Fresnel lens.

Specifically, the second Fresnel lens portion 22$k$ in the light source device of the fourth variant example is a dividing region of the Fresnel lens with an isosceles triangular shape having a vertex that coincides with the center of the Fresnel lens, and the second Fresnel lens portions 22$k$ are arranged such that the base-sides of the isosceles triangular dividing region are in contact with each other. In the light source device of the fourth variant example, light-emitting parts 1$k$ are arranged such that the center of the light-emitting surface of each of the light-emitting parts 1$k$ coincide with the center of a corresponding one of the second Fresnel lens portions 22$k$.

The light source device of the fourth variant example having the above structure can selectively irradiate light onto irradiation areas located at both sides of the base-sides of the isosceles triangles.

Fifth Variant Example

Figure 8:
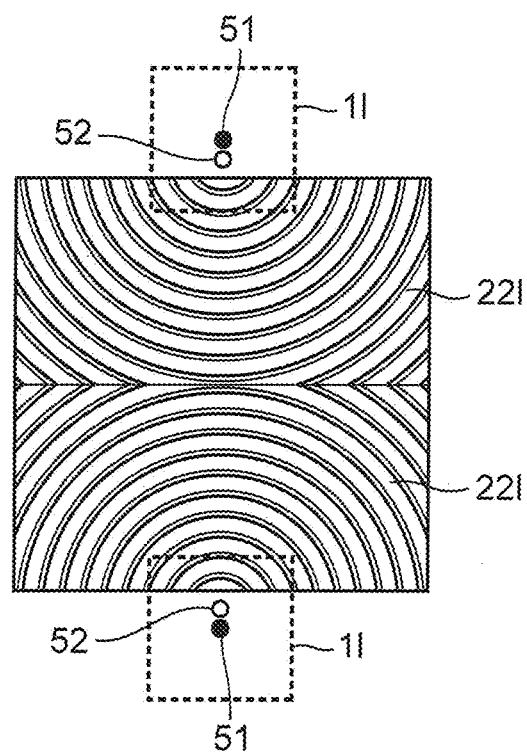
FIG. 8 is a schematic plan view of a light source device according to a fifth variant example.

FIG. 8 is a schematic plan view for illustrating the structure of a light source device of a fifth variant example.

The light source device of the fifth variant example includes lens portions each including a second Fresnel lens portion 22$l$ corresponding to the dividing region 222 of a Fresnel lens shown in FIG. 2.

More specifically, the dividing region 222, which demarcates the second Fresnel lens portion 22$l$, in the light source device of the fifth variant example is an elongated rectangle having short sides and long sides each approximately twice as long as a length of each of the short sides, and the center of a corresponding Fresnel lens of each second Fresnel lens portion 22$l$ is located outside the elongated rectangle near the midpoint of a respective long side of the elongated rectangle. In the light source device of the fifth variant example, the second Fresnel lens portions 22$l$ are arranged such that long sides, opposite to long sides near the centers of corresponding Fresnel lenses, of the second Fresnel lens portions 22$l$ face each other.

The light source device of the fifth variant example having the above structure can selectively irradiate light onto irradiation areas on both sides of the boundary between the second Fresnel lens portions 22$l$.

Sixth Variant Example

Figure 9:
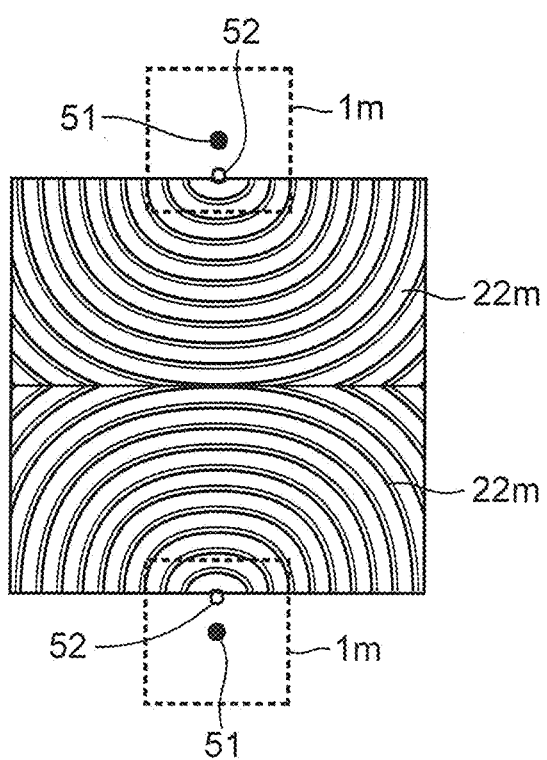
FIG. 9 is a schematic plan view of a light source device according to a sixth variant example.

FIG. 9 is a schematic plan view for illustrating the structure of a light source device of a sixth variant example.

The light source device of the sixth variant example and the light source device of the fifth variant example are the same in that two lens portions respectively include a second Fresnel lens portion corresponding to the dividing region 222 of a Fresnel lens shown in FIG. 2, but are different in that the Fresnel lens corresponding to the second Fresnel lens portion 22$m$ in each lens portion of the light source device of the sixth variant example includes a plurality of elliptic projections.

The light source device of the sixth variant example having the above structure can also selectively irradiate light onto irradiation areas on both sides of the boundary between the second Fresnel lens portions 22$m$.

Seventh Variant Example

Figure 10:
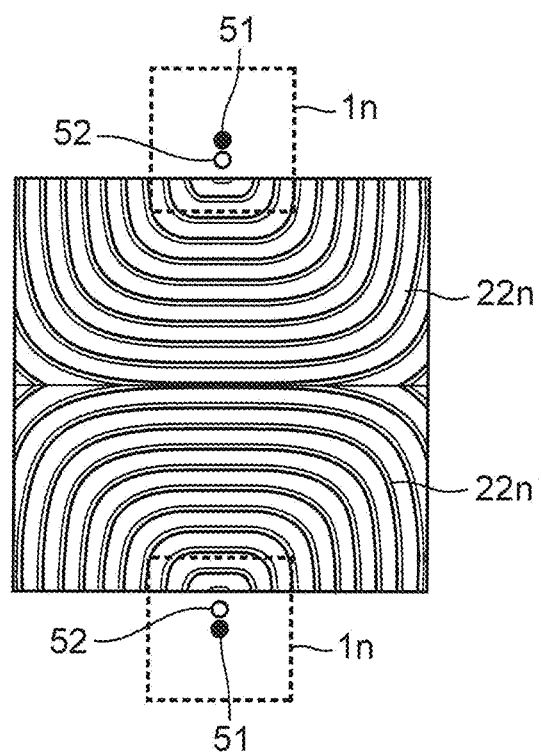
FIG. 10 is a schematic plan view of a light source device according to a seventh variant example.

FIG. 10 is a schematic plan view for illustrating the structure of a light source device of a seventh variant example.

The light source device of the seventh variant example and the light source devices of the fifth and sixth variant examples are the same in that two lens portions respectively include a second Fresnel lens portion corresponding to the dividing region 222 of a corresponding Fresnel lens shown in FIG. 2, but are different in that the corresponding Fresnel lens for the second Fresnel lens portion 22$n$ in each lens portion of the light source device of the seventh variant example includes a plurality of substantially rectangular projections.

The light source device of the sixth variant example having the above structure can also selectively irradiate light onto irradiation areas on both sides of the boundary between the second Fresnel lens portions 22$n$.

As described for the fifth to seventh variant examples having the above structures, irradiation areas on both sides of the boundary between the second Fresnel lens portions 22$l$, 22$m$, or 22$n$ can be selectively illuminated regardless of whether the shape of a plurality of projections of the corresponding Fresnel lens constituting the second Fresnel lens portions is an annular, elliptic, or substantially rectangular loop shape.

Moreover, with an annular, elliptic, or substantially rectangular shape of a plurality of projections of the Fresnel lens constituting the second Fresnel lens portions, a varying extent of the irradiation area to be illuminated and a varying illuminance distribution in the irradiation area can be obtained, so that the extent of the irradiation area according to the shape of the projections and the illuminance distribution in the irradiation area can be obtained.

Eighth Variant Example

Figure 11:
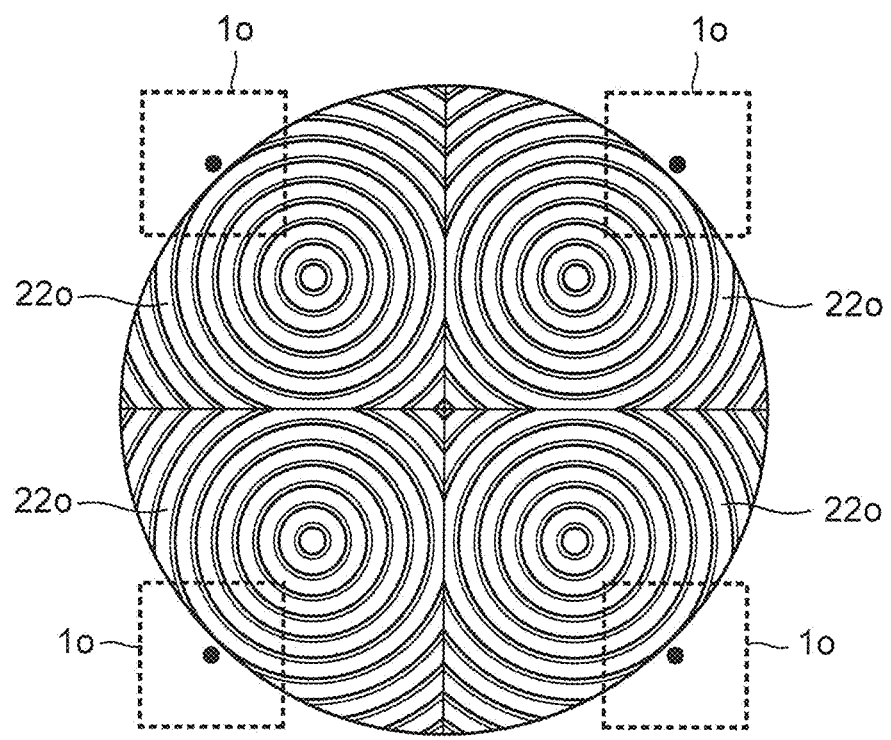
FIG. 11 is a schematic plan view of a light source device according to an eighth variant example.

FIG. 11 is a schematic plan view for illustrating the structure of a light source device of an eighth variant example.

The light source device of the eighth variant example differs from the light source devices of the first embodiment and the first to seventh variant examples in that: (1) the opening of the light-shielding member has a circular shape, (2) the light-guide member in the circular opening includes four lens portions in four fan-shaped regions of the circular opening, and each of the four lens portions includes a first Fresnel lens portion, and (3) the centers of the light-emitting surfaces of four light-emitting parts 1o each corresponding to a respective one of the four lens portions are located on the center lines of the fan-shaped regions and outside the lens portions.

In the light source device of the eighth variant example, the first Fresnel lens portion of each lens portion corresponds to a fan-shaped region of a Fresnel lens including a plurality of loop-shaped projections, in which the fan-shaped region of the corresponding Fresnel lens includes the center of the corresponding Fresnel lens and an entire loop of at least one of the plurality of loop-shaped projections. FIG. 11 shows an example in which the center of the Fresnel lens corresponding to each first Fresnel lens portion is located on the center line of each of fan-shaped regions, but the center of the corresponding Fresnel lens may be out of the center line of each of the fan-shaped regions.

The light source device of the eighth variant example having the above structure can also selectively irradiate light onto irradiation areas each corresponding to a respective one of first Fresnel lens portions 22o.

In the light source device of the eighth variant example, the extent of the irradiation area and the illuminance distribution in the irradiation area can be changed by changing the position of the center of the corresponding Fresnel lens in the fan-shaped region. By appropriately changing the position of the center of the corresponding Fresnel lens within the fan-shaped division, the extent of the irradiation area and the illuminance distribution in the irradiation area can be adjusted.

Ninth Variant Example

Figure 12:
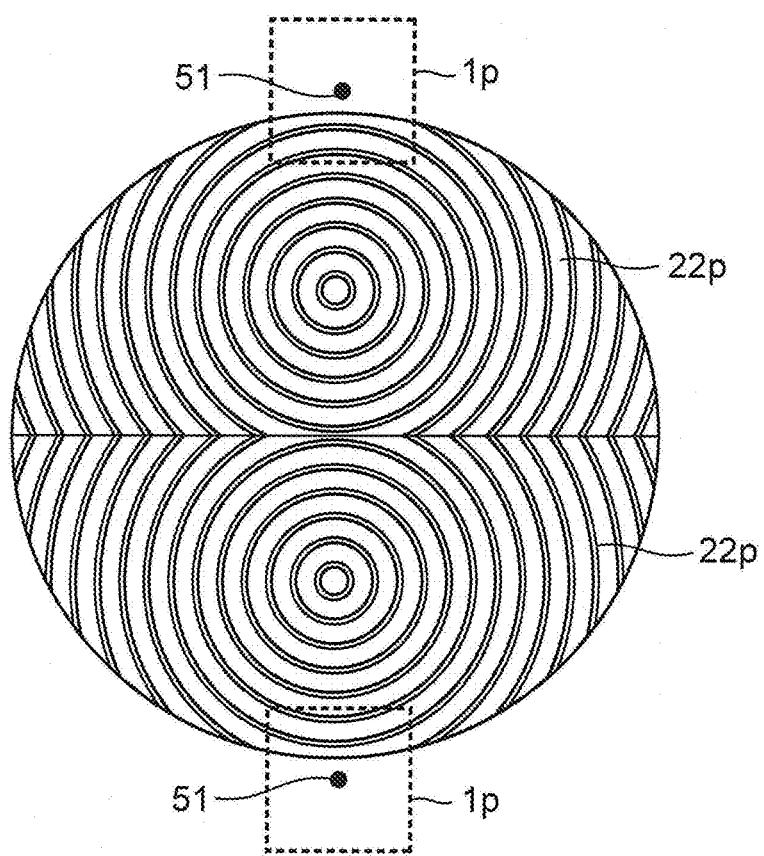
FIG. 12 is a schematic plan view of a light source device according to a ninth variant example.

FIG. 12 is a schematic plan view for illustrating the structure of a light source device of a ninth variant example.

The light source device of the ninth variant example differs from the light source devices of the first embodiment and the first to seventh variant examples in that: (1) the opening of the light-shielding member has a circular shape, (2) the light-guide member includes two lens portions including first Fresnel lens portions formed in two semicircular regions of the circular opening, and (3) the centers of the light-emitting surfaces of two light-emitting parts 1p respectively corresponding to the two lens portions are each located outside the lens portions and on the central line dividing each semicircle into two areas that are in line symmetry.

Specifically, in the light source device of the ninth variant example, the first Fresnel lens portion of each lens portion corresponds to a semicircular region of a Fresnel lens including a plurality of loop-shaped projections, in which the semicircular region includes the center of the corresponding Fresnel lens and includes at least one entire loop of a projection. FIG. 12 shows an example in which the corresponding Fresnel lens is divided such that the center of the corresponding Fresnel lens is located on the center line dividing each semicircle into two areas to be in line symmetry, but the center of the Fresnel lens may be out of the center line of each semicircle.

The light source device of the ninth variant example having the above structure can also selectively project light onto irradiation areas respectively corresponding to first Fresnel lens portions 22p.

In the light source device of the ninth variant example, the extent of the irradiation area and the illuminance distribution in the irradiation area can be changed by changing the position of the center of the corresponding Fresnel lens within the semicircular division. By appropriately changing the position of the center of the corresponding Fresnel lens within the semicircular division, the extent of the irradiation area and the illuminance distribution in the irradiation area can be adjusted.

Tenth Variant Example

Figure 13:
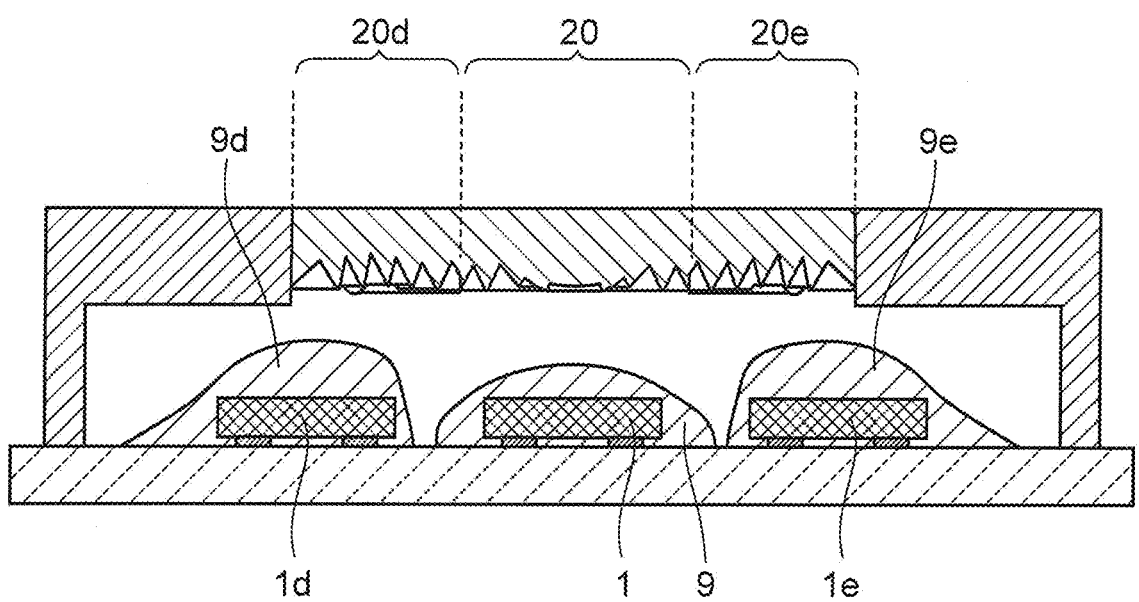
FIG. 13 is a schematic plan view of a light source device according to a tenth variant example.

FIG. 13 is a schematic sectional view for illustrating the structure of a light source device of a tenth variant example.

The light source device of the tenth variant example is substantially the same as the light source device of the first embodiment except that the light source device further includes light-transmissive members that cover the light-emitting parts 1 and 1a to 1h and function as lenses.

That is, in the light source device of the first embodiment, covering portions of the light-emitting surfaces of some of the light-emitting parts with the light-shielding member 10 allows for increasing the difference between the illuminance in a desired irradiation area and the illuminance outside the irradiation area when light is irradiated onto the desired irradiation area.

However, with portions of the light-emitting surfaces of some of the light-emitting parts covered with the light-shielding member 10, light emitted from the some of the light-emitting parts is absorbed or reflected by the light-shielding member, and thus may not be effectively utilized.

In this regard, the light source device of the tenth variant example includes light-transmissive members each covering a respective one of the light-emitting parts 1 and 1a to 1h and function as lenses to condense light emitted from the light-emitting parts 1 and 1a to 1h and irradiate the light toward the lens portions 20 and 20a to 20h corresponding to the light-emitting parts 1 and 1a to 1h, respectively.

In the light source device of the tenth variant example, the light-emitting part 1 and the lens portion 20 are arranged such that the optical axis of light emitted from the light-emitting surface of the light-emitting part 1 substantially coincides with the optical axis of the lens portion 20, and the distribution characteristics of light emitted from the light-emitting surface of the light-emitting part 1 are substantially symmetrical about the optical axis. Accordingly, a light-transmissive member (i.e., first convex lens) 9 covering the light-emitting part 1 has a shape that allows for condensing light emitted from the light-emitting part 1 so that the light does not spread to the outside of the lens portion 20.

Other light-transmissive members (i.e., second convex lenses) 9d and 9e covering the light-emitting parts 1d and 1e have a shape that allows most of light emitted from the light-emitting parts 1d and 1e to be irradiated toward the lens portions 20d and 20e. Still other light-transmissive members, which are not shown in figures, covering the other light-emitting parts have a shape that allows most of light emitted from each light-emitting part to be irradiated toward the corresponding lens portion. In other words, in the light source device of the tenth variant example, the optical axes of at least a portion (such as light-emitting parts except for the central light-emitting part 1) of the light-emitting parts are inclined toward the center of the light-guide member.

The light source device of the tenth variant example having the above structure has substantially the same effects as the light source device of the first embodiment and can provide higher illuminance in each irradiation area than in the light source device of the first embodiment.

The above light source device of the tenth variant example includes the light-transmissive member (i.e., first convex lens) 9 covering the light-emitting part 1 and the light-transmissive members (i.e., second convex lenses) covering the light-emitting parts other than the light-emitting part 1 so that the optical axes of the light-emitting parts other than the light-emitting part 1 are inclined toward the center of the light-guide member to enhance the illuminance in each irradiation area.

Instead of disposing the light-transmissive members (second convex lenses) covering the light-emitting parts other than the light-emitting part 1, the light-emitting parts other than the light-emitting part 1 may be inclined so that their optical axes are inclined toward the center of the light-guide member to irradiate most of light emitted from each light-emitting part toward the corresponding lens portion.

This structure allows for providing substantially the same effects as the light source device of the tenth variant example.

In the case in which the light-emitting parts other than the light-emitting part 1 are inclined toward the inside of the opening of the light-shielding member, the light-transmissive member (first convex lens) covering the light-emitting part 1 may be disposed or may not be disposed.

Example 1

An example will be described below.

For a light source device of Example 1, irradiation of light emitted from the light-emitting parts 1 and 1a to 1h through the lens portions 20 and 20a to 20h was determined by a simulation based on the light source device of the first embodiment shown in FIG. 1A to FIG. 1C. The simulation was performed on the assumption that the light-emitting part shown in FIG. 1F was used for the light-emitting parts 1 and 1a to 1h. The light-emitting surfaces of the light-emitting parts 1 and 1a to 1h had a square shape with a side length of 0.8 mm.

The light-emitting parts 1 and 1a to 1h were arranged such that the centers of their light-emitting surfaces coincided with the coordinates below, with the center of the light-emitting surface of the light-emitting part 1 being the origin. The following coordinates are represented in millimeters (mm).

The center of the light-emitting surface of the light-emitting part 1: the origin (0, 0)

The center of the light-emitting surface of the light-emitting part 1a: (−1.7, 1.7)

The center of the light-emitting surface of the light-emitting part 1b: (0, 1.6)

The center of the light-emitting surface of the light-emitting part 1c: (1.7, 1.7)

The center of the light-emitting surface of the light-emitting part 1d: (−1.6, 0)

The center of the light-emitting surface of the light-emitting part 1e: (1.6, 0)

The center of the light-emitting surface of the light-emitting part 1f: (−1.7, −1.7)

The center of the light-emitting surface of the light-emitting part 1g: (0, −1.6)

The center of the light-emitting surface of the light-emitting part 1h: (1.7, 1.7)

The light-shielding member 10 was assumed to be made of a member with a reflectance of 75% having a square opening with a side of 3.4 mm, and the center of the opening was assumed to be located on the central axis of the light-emitting surface of the central light-emitting part 1.

In this arrangement, the light-shielding member was assumed to cover a portion of the light-emitting surface of each of the light-emitting parts 1a, 1c, 1f with a width of 0.4 mm from each of two sides defining the outermost corner of the light-emitting surface of each of the light-emitting parts 1a, 1c, 1f, and 1h, and a portion of the light-emitting surface of each of the light-emitting parts 1b, 1d, 1e, and 1g with a width of 0.3 mm from the outermost side of the light-emitting surface of each of the light-emitting parts 1b, 1d, 1e, and 1g.

In the light source device of the first example, the light-guide member 23 was assumed to be made of a material having a refractive index of 1.59 at 440 nm, a refractive index of 1.57 at 540 nm, and a refractive index of 1.56 at 640 nm and to be the same size as the opening of the light-shielding member in terms of the outside shape, and the lens portions 20 and 20a to 20h were assumed to be formed as follows.

It was assumed that the lower surface of the light-guide member was divided correspondingly to the lens portions 20 and 20a to 20h; a second Fresnel lens portion including a projection with a radius of 0.74 mm closest to the center of the Fresnel lens, a projection with a radius of 1.16 mm furthest from the center, and four projections with gradually varied radii therebetween was formed in each of the four corner portions constituting the lens portions 20a, 20c, 20f, and 20h; another second Fresnel lens portion including a projection with a radius of 0.57 mm closest to the center of the Fresnel lens, a projection with a radius of 1.36 mm furthest from the center, and four projections with gradually varied radii therebetween was formed in each of zones constituting the lens portions 20b, 20d, 20e, and 20g; and a first Fresnel lens portion including a projection with a radius of 0.15 mm having a circular planar shape at the center, an annular projection with a radius of 0.84 mm furthest from the center, and four projections with gradually varied radii therebetween was formed in the central portion of the light-guide member constituting the lens portion 20.

Under the above conditions, the illuminance distribution on an irradiation surface 30 cm away from the light source when all or some of the light-emitting parts were turned on was determined by a simulation.

Figure 14A:
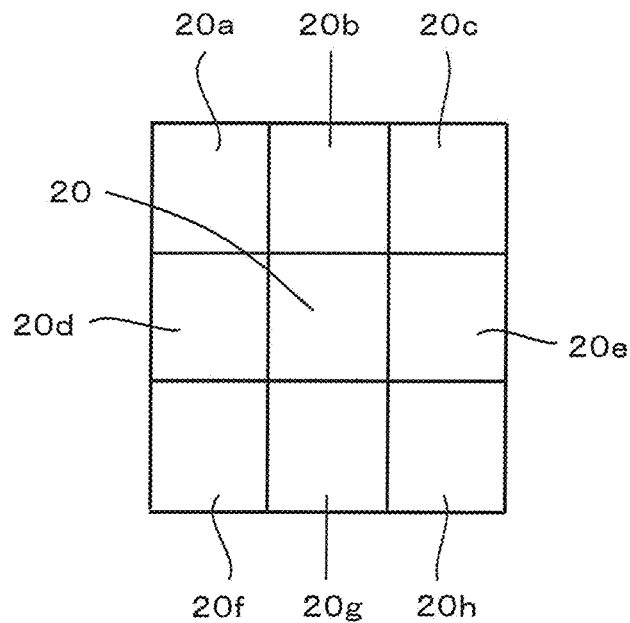
Figure 14B:
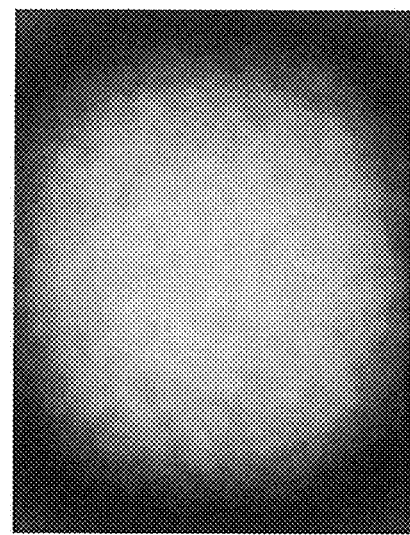

FIGS. 14A and 14B show the illuminance distribution on the irradiated surface when all of nine light-emitting parts 1 and 1a to 1h were turned on.

Figure 15A:
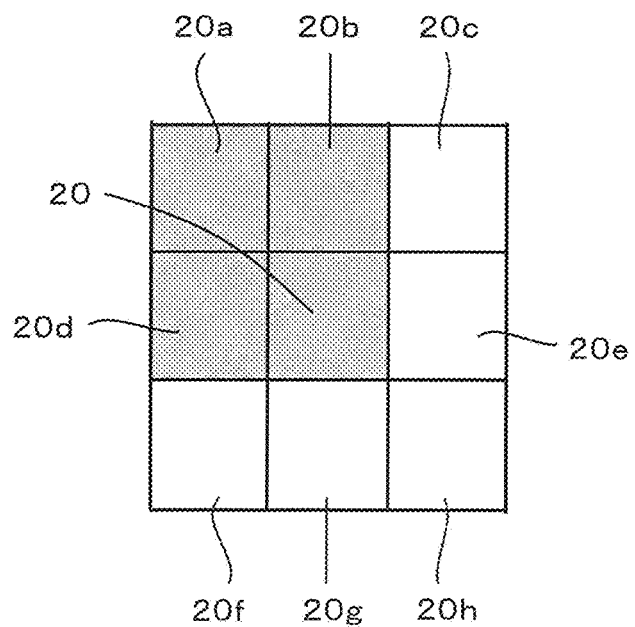
Figure 15B:
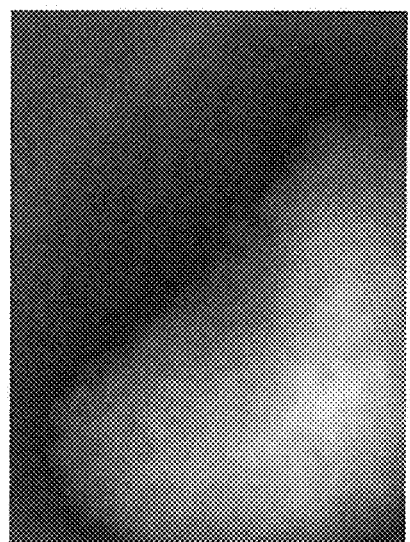

FIGS. 15A and 15B show the illuminance distribution on the irradiated surface when five light-emitting parts 1c, 1e, 1h, 1g, and 1f of the nine light-emitting parts 1 and 1a to 1h were turned on.

Figure 16A:
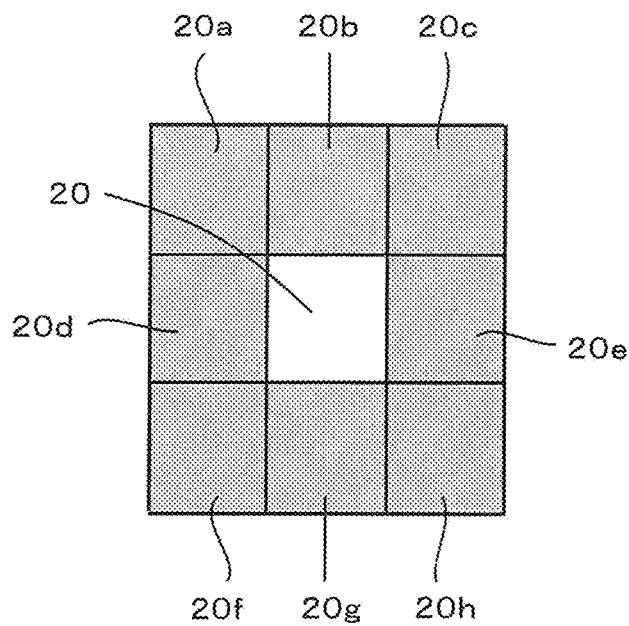
Figure 16B:
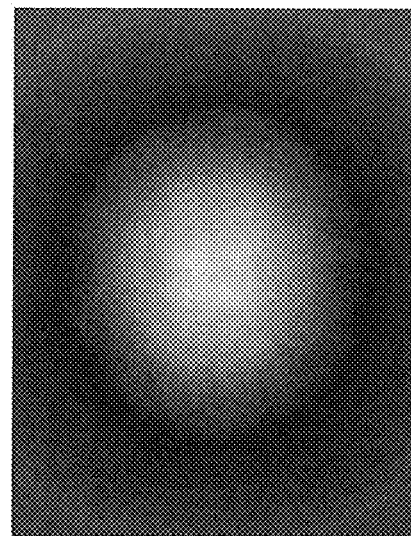

FIGS. 16A and 16B show the illuminance distribution on the irradiated surface when a single light-emitting part 1 located on the central portion among the nine light-emitting parts 1 and 1a to 1h was turned on.

Figure 17A:
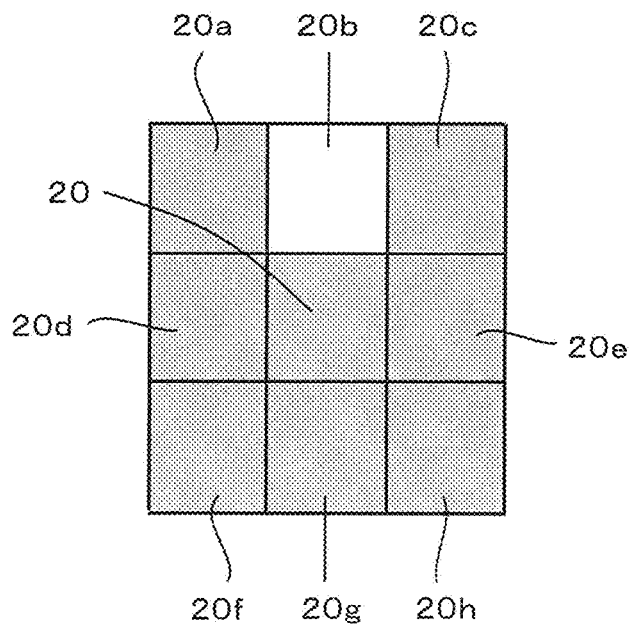
Figure 17B:
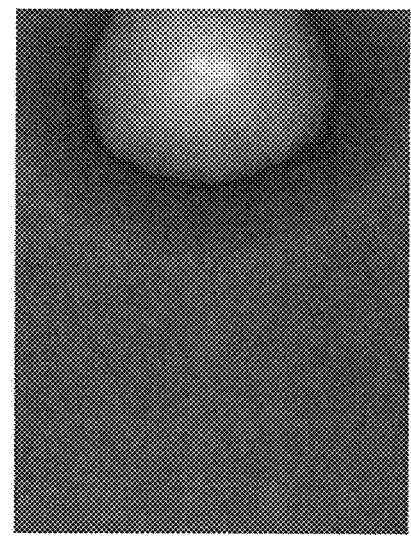

FIGS. 17A and 17B show the illuminance distribution on the irradiated surface when a single light-emitting part 1b of the nine light-emitting parts 1 and 1a to 1h was turned on.

Figure 18A:
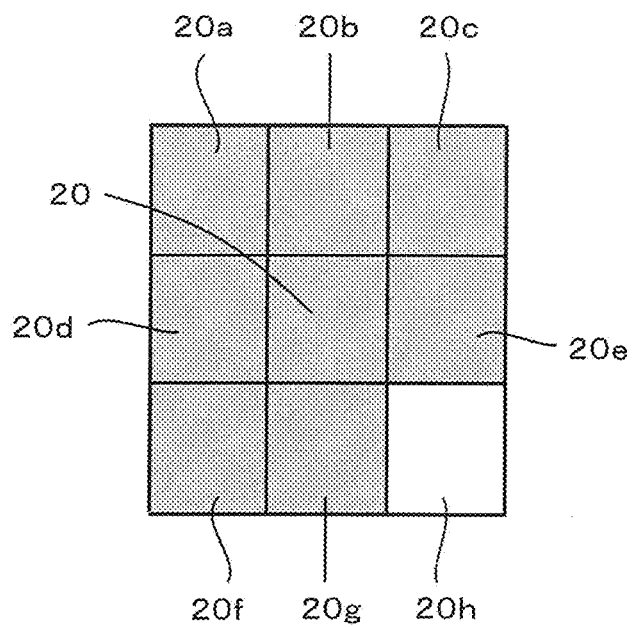
Figure 18B:

FIGS. 18A and 18B shows the illuminance distribution on the irradiated surface when a single light-emitting part 1h of the nine light-emitting parts 1 and 1a to 1h was turned on.

In FIG. 14A to FIG. 18B, FIGS. 14A, 15A, 16A, 17A and 18A show lighting conditions of the light-emitting parts 1 and 1a to 1h using the lens portions 20 and 20a to 20h, and FIGS. 14B, 15B, 16B, 17B and 18B show the illuminance distributions on the irradiated surface.

As shown in FIG. 14A to FIG. 18B, it was confirmed that the light source device of the first embodiment can selectively irradiate light onto one or a plurality of desired irradiation areas and can increase the difference between the illuminance inside a desired irradiation region (i.e., one or a plurality of desired irradiation areas) and the illuminance outside the irradiation region when the desired irradiation region is illuminated.

The light source device of certain embodiments the present invention can irradiate light onto a desired irradiation region and can be therefore suitably used for lighting apparatuses, flashes for cameras, headlights of vehicles, and the like, and any other appropriate applications.

What is claimed is:

1. A light source device comprising:
   a light-shielding member defining an opening;
   a light-guide member located in the opening in a top view and including two or more divided lens portions; and
   a plurality of light-emitting parts disposed such that each of the plurality of light-emitting parts corresponds to a respective one of the lens portions, each of the plurality of light-emitting parts being configured to be individually turned on,
   wherein each of the light-emitting parts has an upper surface serving as a light-emitting surface,
   wherein the two or more lens portions are Fresnel lenses, and
   wherein irradiation areas corresponding to the light-emitting parts are at least partially different from each other.

2. The light source device according to claim 1,
   wherein each of the lens portions comprises:
      a first Fresnel lens portion comprising a plurality of concentric loop-shaped projections formed on a lower surface of the light-guide member, or
      a second Fresnel lens portion comprising a plurality of projections that correspond to a portion of a plurality of concentric loop-shaped projections.

3. The light source device according to claim 2,
   wherein the plurality of concentric loop-shaped projections of the first Fresnel lens portion or the second Fresnel lens portion form concentric circles or concentric ellipses.

4. The light source device according to claim 2, wherein: the plurality of light-emitting parts include four light-emitting parts arranged such that a shape formed by imaginary lines connecting centers of the light-emitting surfaces of the four light-emitting parts is a rectangle, and such that portions of the light-emitting surfaces are covered with a light-shielding unit outside the opening, and the two or more lens portions include four lens portions, each corresponding to a respective one of the four light-emitting parts and each comprising the second Fresnel lens portion, such that the four lens portions comprise four second Fresnel lens portions and
   the four second Fresnel lens portions corresponding to the four lens portions are arranged such that a shape formed by imaginary lines connecting centers of the plurality of concentric loop-shaped projections is a rectangle.

5. The light source device according to claim 4,
   wherein shapes of the lens portions respectively corresponding to the four light-emitting parts are substantially the same.

6. The light source device according to claim 4, wherein: the light-emitting surfaces of the four light-emitting parts have a quadrilateral shape, and
   a portion of each of the light-emitting surfaces with a predetermined width from a side of each of the quadrilateral light-emitting surfaces is covered with the light-shielding member.

7. The light source device according to claim 6,
   wherein a portion of each of the quadrilateral light-emitting surfaces with a predetermined width from each of two sides defining a corner of each of the quadrilateral light-emitting surfaces of the four light-emitting parts is covered with the light-shielding member.

8. The light source device according to claim 4, wherein: the plurality of light-emitting parts further include an additional light-emitting part between two light-emitting parts that are diagonally opposite to each other, among the four light-emitting parts, and
   the plurality of lens portions further include an additional lens portion corresponding to the additional light-emitting part and comprising the first Fresnel lens portion.

9. The light source device according to claim 8, wherein: the plurality of projections of the four second Fresnel lens portions corresponding to the four light-emitting parts have a partial annular shape,
   the plurality of concentric loop-shaped projections of the first Fresnel lens portion corresponding to the additional light-emitting part have an annular shape, and
   a radius of curvature of an outermost concentric loop-shaped projection of the first Fresnel lens portion corresponding to the additional light-emitting part is smaller than a radius of curvature of an outermost projection of each of the four second Fresnel lens portions corresponding to the four light-emitting parts.

10. The light source device according to claim 4, wherein: the plurality of light-emitting parts further include at least one additional light-emitting part disposed between two light-emitting parts that are disposed at both ends of a corresponding side of the rectangle, of the four light-emitting parts, and
   the plurality of lens portions further include at least one additional lens portion corresponding to the at least one additional light-emitting part, and
   the at least one lens portion corresponding to the at least one additional light-emitting part comprises an additional second Fresnel lens portion.

11. The light source device according to claim 10, wherein:
   the at least one additional light-emitting part includes a plurality of additional light-emitting parts disposed between the two light-emitting parts disposed at both ends of the corresponding side of the rectangle, of the four light-emitting parts, and
   the at least one additional lens portion includes a plurality of additional lens portions, each corresponding to a respective one of the additional light-emitting parts, the plurality of additional lens portions having substantially the same shape.

12. The light source device according to claim 10, wherein:
   a light-emitting surface of the at least one additional light-emitting part has a quadrilateral shape, and
   a portion of the light-emitting surface of the at least one additional light-emitting part with a predetermined width from a side of the quadrilateral light-emitting surface is covered with the light-shielding member.

13. The light source device according to claim 10, wherein:
   the plurality of projections of the four second Fresnel lens portions corresponding to the four light-emitting parts have a partial annular shape,
   the plurality of projections of the additional second Fresnel lens portion corresponding to the at least one additional light-emitting part have a partial annular shape, and
   a radius of curvature of an outermost projection of the plurality of projections of the additional second Fresnel lens portion corresponding to the at least one additional light-emitting part is larger than a radius of curvature of an outermost projection of the plurality of projections of each of the four second Fresnel lens portions corresponding to the four light-emitting parts.

14. The light source device according to claim 1, wherein the Fresnel lenses include at least one Fresnel lens having a plurality of substantially rectangular projections formed on a lower surface of the light-guide member.

15. A light source device comprising:
   a light-shielding member defining an opening;
   a light-guide member located in the opening in a top view and including two or more divided lens portions; and
   a plurality of light-emitting parts disposed such that each of the plurality of light-emitting parts corresponds to a respective one of the lens portions,
   wherein each of the light-emitting parts has an upper surface serving as a light-emitting surface,
   wherein the plurality of light-emitting parts include four first light-emitting parts arranged such that a shape formed by imaginary lines connecting centers of the light-emitting surfaces of the four first light-emitting parts is a rectangle, and such that portions of the light-emitting surfaces are covered with a light-shielding unit outside the opening, and at least one second light-emitting part disposed directly between two light-emitting parts that are disposed at both ends of a corresponding side of the rectangle, and
   wherein a center of a light-emitting surface of the second light-emitting part is positioned inside the rectangle.

16. The light source according to claim 15, wherein the opening of the light-shielding member has a rectangle shape in a top view.

17. The light source according to claim 16, wherein the opening of the light-shielding member has chamfered corners.

18. The light source according to claim 15, wherein the opening of the light-shielding member has a circular shape in a top view.

19. The light source according to claim 15, wherein each of the plurality of light-emitting parts is configured to be individually turned on.

* * * * *